(12) United States Patent
Zhu

(10) Patent No.: US 11,817,480 B2
(45) Date of Patent: Nov. 14, 2023

(54) SEMICONDUCTOR DEVICE WITH U-SHAPED CHANNEL AND ELECTRONIC APPARATUS INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 360 days.

(21) Appl. No.: 17/112,343

(22) Filed: Dec. 4, 2020

(65) Prior Publication Data

US 2021/0175332 A1    Jun. 10, 2021

(30) Foreign Application Priority Data

Dec. 6, 2019    (CN) .......................... 201911254752.X

(51) Int. Cl.
*H01L 29/06*    (2006.01)
*H01L 29/41*    (2006.01)
(Continued)

(52) U.S. Cl.
CPC ........ *H01L 29/1033* (2013.01); *H01L 27/092* (2013.01); *H01L 29/42356* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 5,955,763 A * 9/1999 Lin ................... H01L 29/41758
257/365
6,972,461 B1 * 12/2005 Chen ...................... H01L 29/785
257/353
(Continued)

FOREIGN PATENT DOCUMENTS

| CN | 107887384 | 4/2018 |
| CN | 109888001 | 6/2019 |
| CN | 110021667 | 7/2019 |

OTHER PUBLICATIONS

Chinese Office Action issued in corresponding Chinese Patent Application No. 201911254752, dated Dec. 14, 2021.
(Continued)

*Primary Examiner* — Maliheh Malek
(74) *Attorney, Agent, or Firm* — Pillsbury Winthrop Shaw Pittman, LLP

(57) ABSTRACT

A semiconductor device with U-shaped channel and electronic apparatus including the same are disclosed. the semiconductor device includes a first device and a second device opposite to each other on a substrate. The two devices each include: a channel portion vertically extending on the substrate and having a U-shape in a plan view; source/drain portions respectively located at upper and lower ends of the channel portion and along the U-shaped channel portion; and a gate stack overlapping the channel portion on an inner side of the U-shape. An opening of the U-shape of the first device and an opening of the U-shape of the second device are opposite to each other. At least a portion of the gate stack of the first device close to the channel portion and at least a portion of the gate stack of the second device close to the channel portion are substantially coplanar.

39 Claims, 22 Drawing Sheets

(51) Int. Cl.
*H01L 29/423* (2006.01)
*H01L 27/092* (2006.01)
*H01L 29/10* (2006.01)
*H01L 29/78* (2006.01)
H01L 21/8234 (2006.01)
H01L 21/8238 (2006.01)

(52) U.S. Cl.
CPC .. *H01L 29/7802* (2013.01); *H01L 21/823412* (2013.01); *H01L 21/823807* (2013.01); *H01L 21/823885* (2013.01)

(58) Field of Classification Search
CPC ........... H01L 27/1211; H01L 29/41791; H01L 29/66795–66818; H01L 29/785–7856; H01L 29/04–045; H01L 29/16–1608; H01L 29/18–185; H01L 29/22–2206; H01L 29/36–365; H01L 29/1037; H01L 2029/7857–7858; H01L 2924/13067; H10B 12/056; H10B 12/36
See application file for complete search history.

(56) References Cited

U.S. PATENT DOCUMENTS

| | | | | |
|---|---|---|---|---|
| 8,647,938 | B1* | 2/2014 | Baars | H10B 10/12 438/587 |
| 10,008,512 | B2* | 6/2018 | Kwak | H01L 29/7883 |
| 10,170,473 | B1* | 1/2019 | Zang | H01L 29/7827 |
| 11,532,743 | B2* | 12/2022 | Zhu | H01L 29/7848 |
| 2011/0291177 | A1* | 12/2011 | Lee | H10B 43/27 257/E21.423 |
| 2012/0217564 | A1* | 8/2012 | Tang | H01L 29/7889 438/270 |
| 2013/0001682 | A1* | 1/2013 | Tang | H01L 27/1203 438/270 |
| 2013/0153978 | A1* | 6/2013 | Lee | H01L 29/66833 257/314 |
| 2016/0020221 | A1* | 1/2016 | Oh | H10B 43/35 257/324 |
| 2016/0056295 | A1* | 2/2016 | Wen | H01L 29/7853 257/369 |
| 2016/0071869 | A1* | 3/2016 | Lee | H01L 21/28008 257/314 |
| 2016/0099250 | A1* | 4/2016 | Rabkin | H01L 29/40117 257/66 |
| 2016/0118403 | A1* | 4/2016 | Yoo | H01L 21/31111 438/269 |
| 2016/0225754 | A1* | 8/2016 | Jang | H01L 23/53257 |
| 2017/0047340 | A1* | 2/2017 | Huo | H01L 29/7887 |
| 2017/0098709 | A1* | 4/2017 | Dias | H01L 27/1211 |
| 2017/0287929 | A1* | 10/2017 | Kim | H01L 28/00 |
| 2018/0097111 | A1* | 4/2018 | Zhu | H01L 21/823807 |
| 2018/0366545 | A1* | 12/2018 | Deng | B82Y 10/00 |
| 2019/0198667 | A1* | 6/2019 | Liu | H01L 29/78 |
| 2019/0198669 | A1* | 6/2019 | Park | H01L 29/0657 |
| 2019/0214482 | A1* | 7/2019 | Xie | H01L 29/0673 |
| 2019/0237580 | A1* | 8/2019 | Bi | H01L 27/1211 |
| 2019/0279980 | A1* | 9/2019 | Zhu | G05B 23/0216 |
| 2019/0363090 | A1* | 11/2019 | Reznicek | H01L 29/42392 |
| 2020/0083380 | A1* | 3/2020 | Lai | H01L 29/78696 |
| 2020/0144254 | A1* | 5/2020 | Song | H01L 29/0847 |
| 2020/0321434 | A1* | 10/2020 | Cheng | H01L 29/16 |
| 2021/0175355 | A1* | 6/2021 | Zhu | H01L 29/66545 |
| 2021/0226004 | A1* | 7/2021 | Zhu | H01L 29/0673 |
| 2022/0359265 | A1* | 11/2022 | Chang | H01L 27/088 |
| 2023/0164989 | A1* | 5/2023 | Kao | H01L 27/1211 257/314 |

OTHER PUBLICATIONS

U.S. Office Action issued in corresponding U.S. Appl. No. 17/110,630, dated Feb. 9, 2022.

* cited by examiner

SEMICONDUCTOR DEVICE WITH U-SHAPED CHANNEL AND ELECTRONIC APPARATUS INCLUDING THE SAME This application claims the benefit of Chinese Patent Application No. 201911254752.x filed on Dec. 6, 2019, which is incorporated herein in its entirety by reference.

TECHNICAL FIELD

The present disclosure relates to the field of semiconductors, and in particular to a semiconductor device with a U-shaped channel and an electronic apparatus including such a semiconductor device.

BACKGROUND

With the continuous miniaturization of semiconductor devices, devices with various structures such as fin field effect transistors (FinFET) and multi-bridge channel field effect transistors (MBCFET) etc., have been proposed.

SUMMARY

However, these devices still cannot meet the requirements on increasing integration density and enhancing device performance due to the limitation of device structure.

In view of this, an object of the present disclosure is at least partially to provide, for example, a semiconductor device having a U-shaped channel and an electronic apparatus including such a semiconductor device.

According to an aspect of the present disclosure, there is provided a semiconductor device including a first device and a second device opposite to each other on a substrate. The first device and the second device each include: a channel portion extending vertically on the substrate and having a U-shape in a plan view; source/drain portions respectively located at upper and lower ends of the channel portion and along the U-shaped channel portion; and a gate stack overlapping the channel portion on an inner side of the U-shape. An opening of the U-shape of the first device and an opening of the U-shape of the second device are opposite to each other. At least a portion of the gate stack of the first device close to the channel portion and at least a portion of the gate stack of the second device close to the channel portion are substantially coplanar.

According to an aspect of the present disclosure, there is provided an electronic apparatus including a semiconductor device as described herein.

According to embodiments of the present disclosure, a semiconductor device having a new structure is provided, which has advantages of, for example, high performance and high density.

BRIEF DESCRIPTION OF THE DRAWINGS

The above and other objectives, features, and advantages of the present disclosure will be clearer by reference to the following description of embodiments of the present disclosure in combination with the accompanying drawings. In the accompanying drawings.

Figure 1:
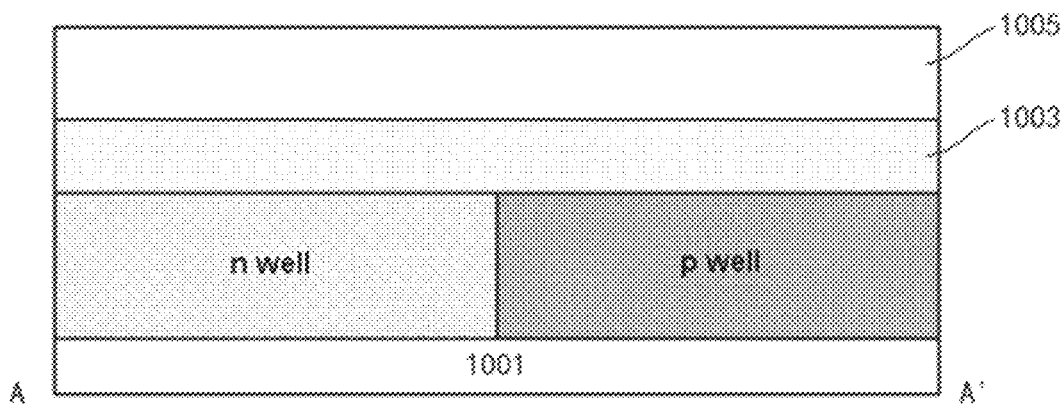
FIGS. 1-25 schematically show some stages in the process of manufacturing a semiconductor device according to embodiments of the present disclosure, wherein FIGS. 3(*a*), 4, 5(*a*), 6(*a*), 9(*a*), 11(*a*), 15(*a*), 21(*a*), 22(*a*) and 23(*a*) are top views, FIGS. 1, 2, 3(*b*), 5(*b*), 6(*b*), 7(*a*), 7(*b*), 8, 9(*b*), 10, 11(*b*), 12(*a*), 13, 14(*a*), 15(*b*), 16(*a*), 17(*a*), 18(*a*), 19(*a*), 20(*a*), 21(*b*), 22(*b*), 24 and 25 are sectional views along respective line AA', FIGS. 11(*c*), 12(*b*), 14(*b*), 15(*c*), 16(*b*), 17(*b*), 18(*b*), 19(*b*) and 20(*b*) are sectional views along respective line BB', and FIG. 23(*b*) is a sectional view along respective line CC'.

Throughout the drawings, the same or similar reference signs indicate the same or similar components.

DETAILED DESCRIPTION OF EMBODIMENTS

The embodiments of the present disclosure are described below with reference to the drawings. However, it should be understood that these descriptions are only exemplary and are not intended to limit the scope of the present disclosure. In addition, commonly known structures and technologies are omitted in the following description to avoid unnecessarily obscuring the concepts of the present disclosure.

The drawings show various structural schematic diagrams according to embodiments of the present disclosure. These figures are not drawn to scale, and some details are enlarged and some details may be omitted for clarity of presentation. The shapes of various regions and layers as well as the relative sizes and positional relationships thereof shown in the figures are only exemplary. In practice, there may be deviations due to manufacturing tolerances or technical limitations, and those skilled in the art may additionally design regions/layers having different shapes, sizes, and relative positions as required.

In the context of the present disclosure, when a layer/an element is referred to as being "on" another layer/element, the layer/element may be directly on another layer/element, or there may be an intermediate layer/element between them. In addition, if a layer/an element is located "on" another layer/element in one orientation, the layer/element may be located "under" another layer/element when the orientation is reversed.

According to an embodiment of the present disclosure, there is provided a semiconductor device including a first device and a second device opposite to each other. The first device and the second device may be vertical semiconductor devices, having active regions arranged vertically on a substrate (for example, in a direction substantially perpendicular to a surface of the substrate). A channel portion may be U-shaped in a plan view (for example, a top view observed from above the substrate), such that the channel portion may be in a form of a U-shaped nano-sheet, and thus such a device may be called a U-shaped nano-sheet field effect transistor (USNFET). A channel width may be increased through the U-shaped channel portion. As described below, the U-shaped nano-sheet may be formed by epitaxial growth, and thus it may be one integrated single piece and may have a substantially uniform thickness. The respective U-shapes of the first device and the second device may be opposite to each other.

The first device and the second device each may further include source/drain portions respectively arranged at upper and lower ends of the channel portion. As described below, the source/drain portions of the first device and the second device may be defined by a same material layer, and thus they may be substantially coplanar (for example, the upper surfaces are substantially coplanar and/or the lower surfaces are substantially coplanar). The source/drain portions may be arranged along the channel portion, such that they may also be U-shaped in the plan view. According to an embodiment, the source/drain portions may protrude towards an inner side of the U-shape with respect to the channel portion, such that the source/drain portions and the channel portion are C-shaped in a sectional view. A protrusion extent of the source/drain portion of the first device with respect to the channel portion may be substantially the same as a protrusion extent of the source/drain portion of the second device with respect to the channel portion.

The C-shape formed by the channel portion and the source/drain portions (i.e., an active region) may facilitate defining a space for accommodating a gate stack. As described below, the gate stacks of the first device and the second device may be defined by a same material layer, and thus at least their end portions on a side close to the channel portion may be substantially coplanar (for example, the upper surfaces are substantially coplanar and/or the lower surfaces are substantially coplanar).

The source/drain portion may have a certain doping. For example, for a p-type device, the source/drain portion may have a p-type doping; and for a n-type device, the source/drain portion may have a n-type doping. The doping profile of the source/drain portion may have an end portion overlapping the gate stack to reduce an external resistance. The channel portion may have a certain doping to adjust a threshold voltage of the device. Alternatively, the semiconductor device may be a junctionless device, in which the channel portion and the source/drain portion may have the same conductivity type doping. Alternatively, the semiconductor device may be a tunneling type device, in which the source/drain portions at both ends of the channel portion may have doping types opposite to each other.

The channel portion may include a single crystal semiconductor material. Of course, the source/drain portion may also include a single crystal semiconductor material. For example, they may both be formed by epitaxial growth.

Such a semiconductor device may be manufactured, for example, as follows.

According to an embodiment, a stack of a first material layer, a second material layer, and a third material layer may be provided on a substrate. The first material layer may define a position of a lower source/drain portion, the second material layer may define a position of a gate stack, and the third material layer may define a position of an upper source/drain portion. The first material layer may be provided by the substrate, such as an upper portion of the substrate. Alternatively, the first material layer, the second material layer, and the third material layer may be sequentially formed on the substrate by, for example, epitaxial growth. If the first material layer and the third material layer are directly used as the source/drain portions, they may be doped in situ while being epitaxially grown.

The stack may be patterned into a bar shape extending in a first direction. A first active layer may be formed on a sidewall of the bar-shaped stack. The first active layer may define the channel portion. Since being formed around the sidewall of the bar-shaped stack, the first active layer may be in a closed shape pattern in a plan view, such as a ring shape, for example, a rectangular ring or a rounded rectangular ring. Two devices may be formed based on the first active layer of this closed shape pattern, such that the channel portion of each device may be U-shaped. Since they may be defined by the same active layer, the inner sidewalls and/or outer sidewalls of the channel portions of the two devices may be substantially coplanar.

The gate stack may be formed inside the closed shape pattern. For this purpose, an opening may be formed in the bar-shaped stack so as to leave a space on an inner side of the closed shape pattern. The opening may also extend substantially in the first direction, such that the above stack has a closed shape pattern, e.g., ring-shaped. This facilitates formation of the source/drain portion along the channel portion. The second material layer may be replaced with a gate stack through the opening formed in such a manner.

In order to facilitate the formation of the source/drain portions, for example, the source/drain portions are formed by doping the first material layer and the third material layer (in particular, in a condition that they are not doped when they are formed), or as described below, the source/drain portions are formed by additionally growing a second active layer, wherein a dummy gate may be formed first. For example, the second material layer may be removed by selective etching through the opening, thereby leaving a space between the first material layer and the second material layer. A dummy gate may be formed in this space. The dummy gate covers a portion of the first active layer between the first material layer and the second material layer.

The source/drain portions may be formed on the upper and lower sides of the dummy gate. For example, the source/drain portions may be formed by doping the first material layer and the third material layer. Such doping may be achieved by a solid phase dopant source layer. As they may be defined by the same material layer, the inner sidewalls and/or outer sidewalls of the source/drain portions of the two devices may be substantially coplanar. Alternatively, the first material layer and the third material layer may be at least partially removed (or even completely removed, thereby exposing the first active layer), and the second active layer may be grown on the upper and lower sides of the dummy gate. The second active layer may be doped in situ during growth. The impurities may be activated by annealing, such that the impurities may diffuse into the first active layer and overlap the end of the dummy gate to a certain extent. After that, the dummy gate may be replaced with a gate stack through a gate replacement process.

The present disclosure may be presented in various forms, some embodiments of which will be described below. In the following description, the selection of various materials is involved. In addition to their functions (for example, semiconductor materials are used to form active regions and dielectric materials are used to form electrical isolation), etching selectivity is also considered for select materials. In the following description, the required etching selectivity may or may not be indicated. It should be clear to those skilled in the art that when etching a certain material layer is mentioned below, if it is not mentioned that other layers are also etched or the figures do not show that other layers are also etched, then such etching may be selective, and the material layer may have an etching selectivity with respect to other layers exposed to the same etching recipe.

FIGS. 1 to 25 schematically illustrate some stages in the process of manufacturing a semiconductor device according to an embodiment of the present disclosure.

As shown in FIG. 1, there is provided a substrate 1001 (an upper portion of which may form the above first material layer). The substrate 1001 may be a substrate in various forms, including but not limited to a semiconductor material substrate such as a bulk Si substrate, a semiconductor-on-insulator (SOI) substrate, a compound semiconductor substrate such as a SiGe substrate, or the like. In the following description, for convenience of description, a bulk Si substrate is taken as an example for description. Here, a silicon wafer is provided as the substrate 1001.

In the substrate 1001, a well region may be formed. If a p-type device is to be formed, the well region may be a n-type well; and if a n-type device is to be formed, the well region may be a p-type well. The well region may be formed, for example, by injecting a corresponding conductivity type dopant (a p-type dopant such as B or In, or a n-type dopant such as As or P) into the substrate 1001 and then performing thermal annealing. There are many ways to create such a well region in the art, which will not be repeated here.

In this embodiment, an example is described in which a p-type device and a n-type device are formed at the same time, and the p-type device and the n-type device are adjacent to each other (a complementary metal oxide semiconductor (CMOS) configuration can then be formed), thereby forming adjacent n-type and p-type wells. However, the present disclosure is not limited to this. For example, devices having the same conductivity type may be formed. Alternatively, devices having different conductivity types may be formed, but the p-type device is formed in a certain region and the n-type device is formed in another region.

On the substrate 1001, a second material layer 1003 and a third material layer 1005 may be formed by, for example, epitaxial growth. The second material layer 1003, having a thickness selected from, for example, about 20 nm-50 nm, may be used to define a position of a gate stack. The third material layer 1005, having a thickness selected from, for example, about 20 nm-200 nm, may be used to define a position of an upper source/drain portion.

The substrate 1001 and the layers formed thereon may have an etching selectivity with respect to each other. For example, in a condition that the substrate 1001 is a silicon wafer, the second material layer 1003 may include SiGe (for example, an atomic percentage of Ge selected from about 10%-30%), and the third material layer 1005 may include Si.

Figure 2:
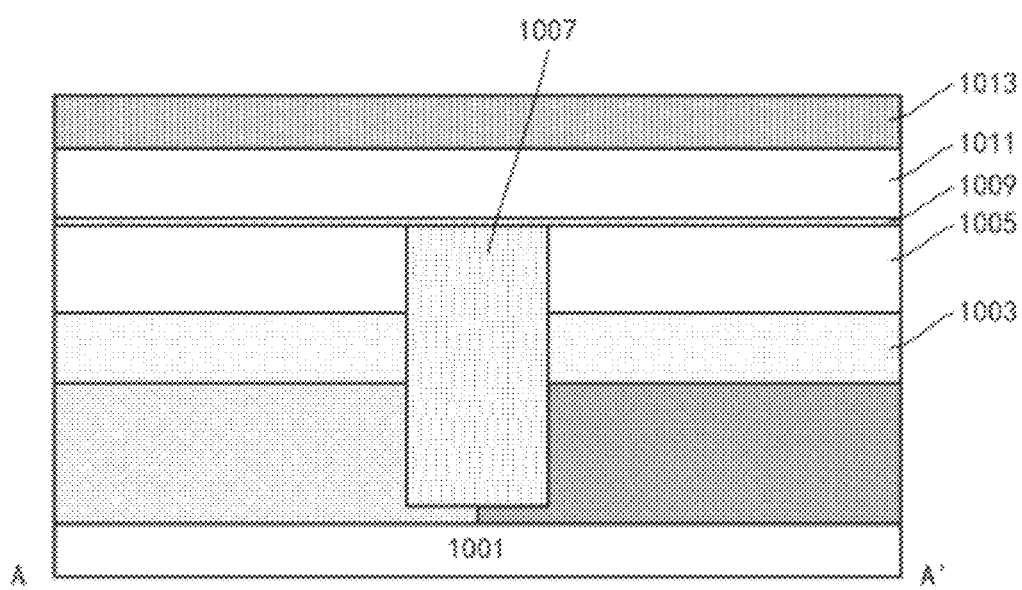

As shown in FIG. 2, in the substrate 1001, an active region may be defined by an isolation portion 1007, such as a shallow trench isolation (STI). For example, the isolation portion 1007 may surround each active region. The isolation portion 1007 may be formed between the n-type well and the p-type well, thereby defining the respective active regions for the p-type device and the n-type device. Here, the isolation portion 1007 may pass through the second material layer 1003 and the third material layer 1005.

According to the embodiment, a spacer pattern transfer technology is used in the following patterning. In order to form a spacer, a mandrel pattern may be formed. Specifically, a layer 1011 used for the mandrel pattern may be formed on the third material layer 1005 by, for example, deposition. For example, the layer 1011 used for the mandrel pattern may include amorphous silicon or polysilicon, having a thickness selected from about 50 nm-150 nm. In addition, for better etching control, an etching stop layer 1009 may be formed first by, for example, deposition. For example, the etch stop layer 1009 may include oxide (for example, silicon oxide) having a thickness selected from about 2 nm-10 nm.

On the layer 1011 used for the mandrel pattern, a hard mask layer 1013 may be formed by, for example, deposition. For example, the hard mask layer 1013 may include nitride (for example, silicon nitride) having a thickness selected from about 50 nm-100 nm.

Figure 3A:
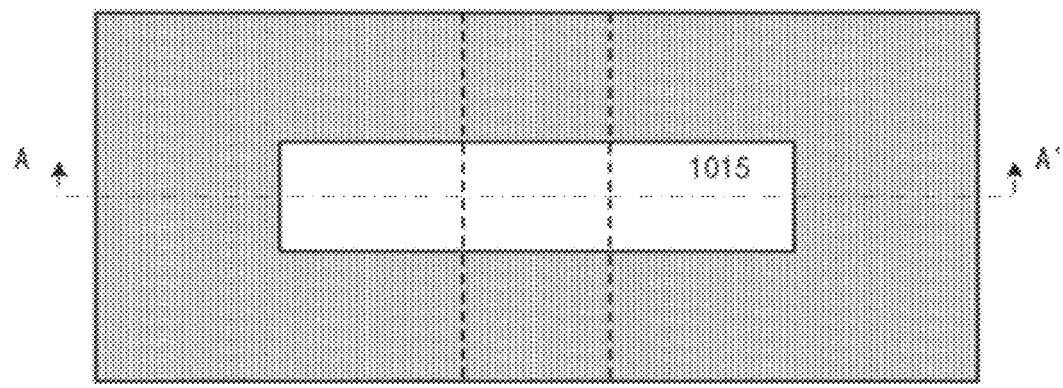
Figure 3B:
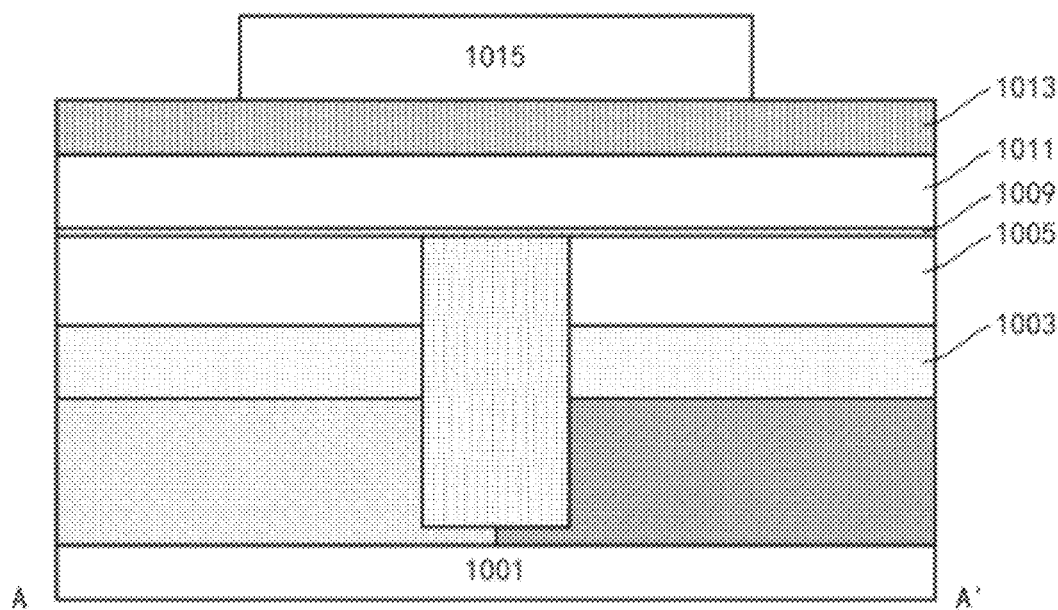
Figure 4:
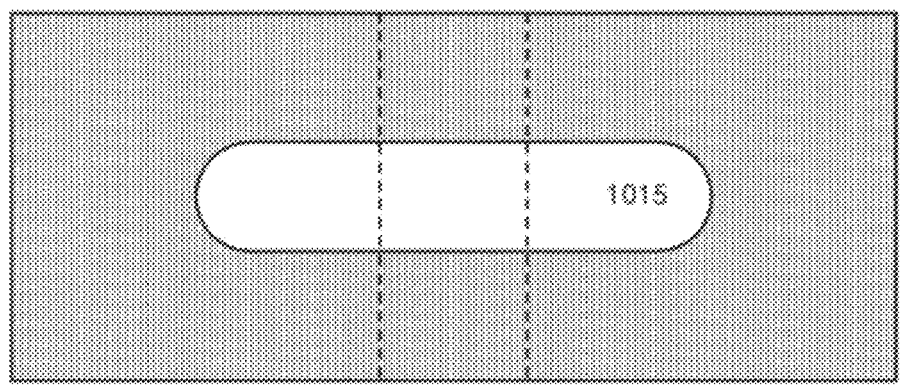

The layer 1011 used for the mandrel pattern may be patterned into a mandrel pattern. For example, as shown in FIGS. 3(a) and 3(b), a photoresist 1015 may be formed on the hard mask layer 1013, and it is patterned by photolithography to a bar extending along a first direction (a horizontal direction in the figures). Here, the bar-shaped pattern is shown as extending on opposite sides of the isolation portion 1007 across the isolation portion 1007, such that two devices may be defined subsequently.

In the embodiment of FIG. 3(a), the portions of the bar-shaped pattern on the opposite sides of the isolation portion 1007 may have substantially the same length, such that the channel portions of the two devices obtained subsequently may have substantially the same channel width. However, the present disclosure is not limited to this. For example, according to performance requirements of the two devices in the design, the extension lengths of the bar-shaped pattern on the opposite sides of the isolation portion 1007 may be different.

In the embodiment of FIG. 3(a), the bar-shaped pattern is shown to have a rectangular shape in a top view. However, the present disclosure is not limited to this. According to other embodiments, the bar-shaped pattern may have another shape, such as an elliptical shape, a rounded rectangular shape (see FIG. 4), or the like.

Figure 5A:
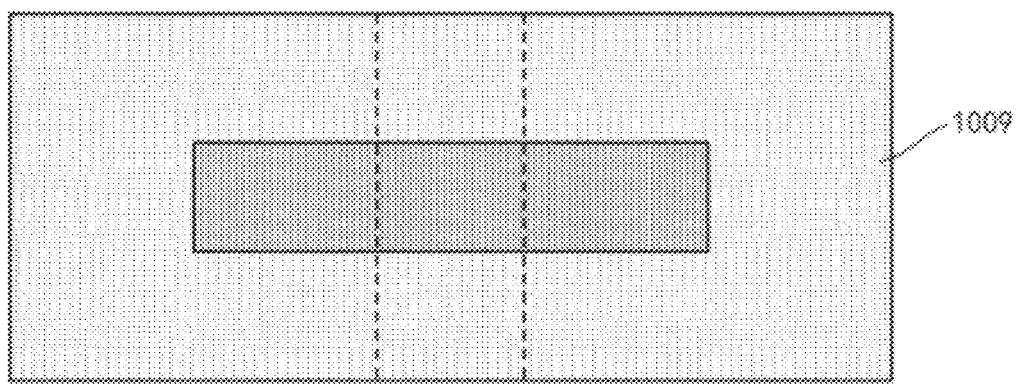
Figure 5B:
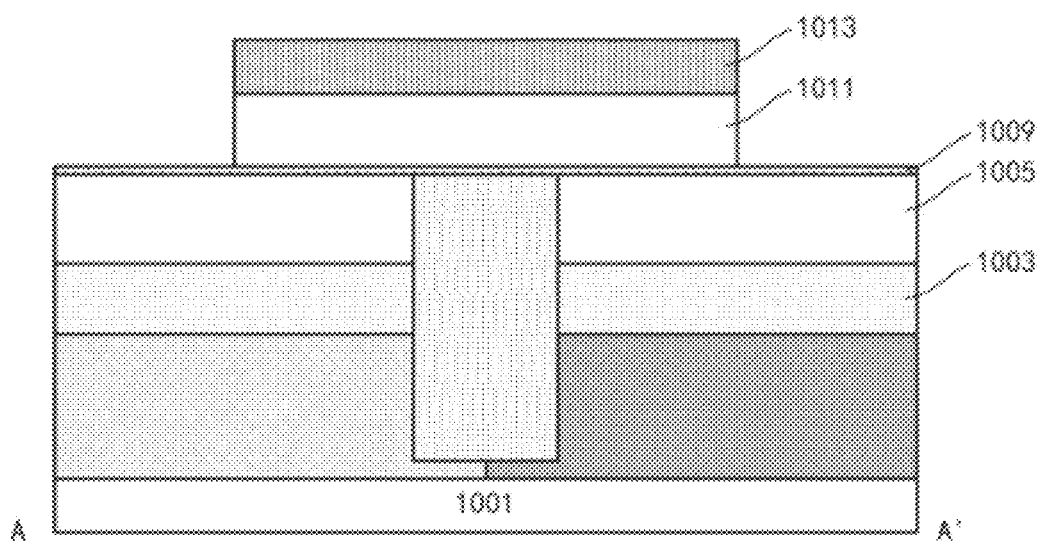

As shown in FIGS. 5(a) and 5(b), the photoresist 1015 may be used as an etching mask. A selective etching is sequentially performed to the hard mask layer 1013 and the layer 1011 used for the mandrel pattern using, for example, reactive ion etching (RIE), and the pattern of the photoresist is transferred to the hard mask layer 1013 and the layer 1011 used for the mandrel pattern. The etching may stop at the etching stop layer 1009. Afterwards, the photoresist 1015 may be removed.

Figure 6A:
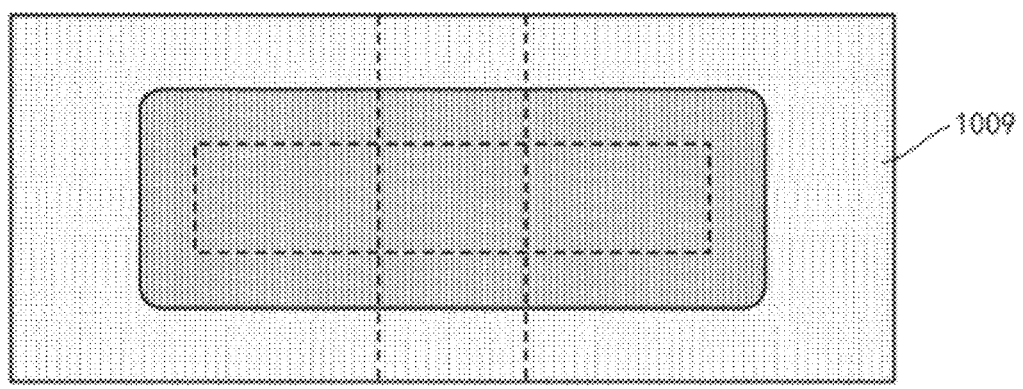
Figure 6B:
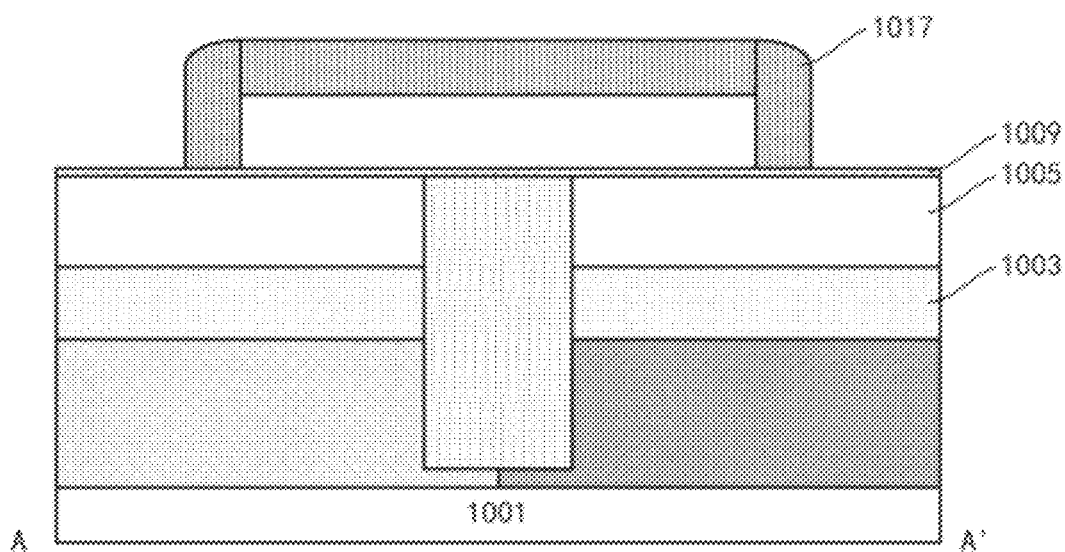

As shown in FIGS. 6(a) and 6(b), a spacer 1017 may be formed on the side wall of the mandrel pattern 1011. For example, a layer of nitride having a thickness selected from about 10 nm-50 nm may be deposited in a substantially conformal manner, and then an anisotropic etching such as RIE (which may be stopped at the etching stop layer 1009) is performed to the deposited nitride layer along a vertical direction so as to remove its lateral extension portion and leave its vertical extension portion, thereby obtaining the spacer 1017. The spacer 1017 may then be used to define the position of the active region of the device.

As shown in the top view of FIG. 6(a), the spacer 1017 may be formed around the side wall of the mandrel pattern 1011 so as to be annular. In this embodiment, the spacer 1017 and the hard mask layer 1013 include the same material (nitride), and thus they may appear as one piece in the top view of FIG. 6(a).

Figure 7A:
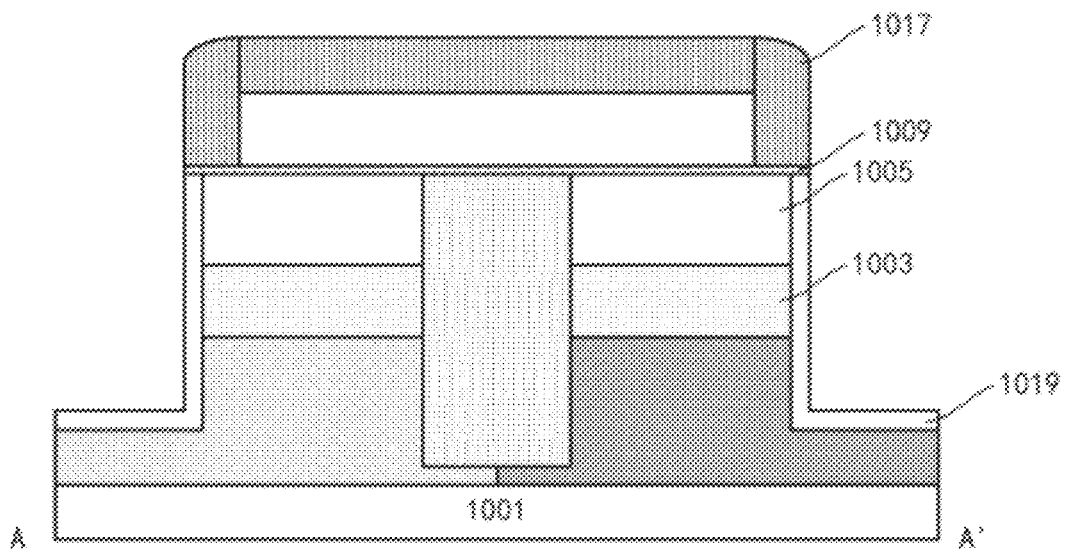

As shown in FIG. 7(a), the hard mask layer 1013 and the spacer 1017 may be used to pattern the third material layer 1005, the second material layer 1003 and the upper portion (the first material layer) of the substrate 1001 into a ridge structure. For example, the hard mask layer 1013 and the spacer 1017 may be used as etching masks, wherein selective etching is sequentially performed to each layer by, for example, RIE, and the pattern is transferred to a lower layer. The etching may enter the well region of the substrate 1001. Thus, on the opposite sides of the isolation portion 1007, the upper portion of the substrate 1001, the second material layer 1003 and the third material layer 1005 may respectively form ridge structures extending in the first direction.

A first active layer may be formed on the sidewall of the ridge structure so as to subsequently define the channel portion. For the convenience of the following patterning, the portion of the first active layer serving as the channel portion may be formed under the spacer 1017 (it may be minimized to provide a protective layer for the channel portion in the following patterning). For example, the ridge structure may be etched back such that its outer peripheral side wall is recessed laterally with respect to an outer peripheral side wall of the spacer 1017. In order to control the etching depth, an atomic layer etching (ALE) may be used. Then, a first active layer 1019 may be formed on the sidewall of the ridge structure by, for example, selective epitaxial growth. Due to the selective epitaxial growth, the first active layer 1019 may be formed on the vertical sidewall of the ridge structure and the surface of the substrate 1001. The first active layer 1019 may then define the channel portion, having a thickness selected from, for example, about 3 nm-15 nm. According to an embodiment of the present disclosure, the thickness of the first active layer 1019 (which is then used as a channel portion) may be determined by an epitaxial growth process, and thus the thickness of the channel portion may be better controlled.

On the opposite sides of the isolation portion 1007, the vertical portion of the first active layer 1019 may respectively form U shapes corresponding to the spacer.

Figure 7B:
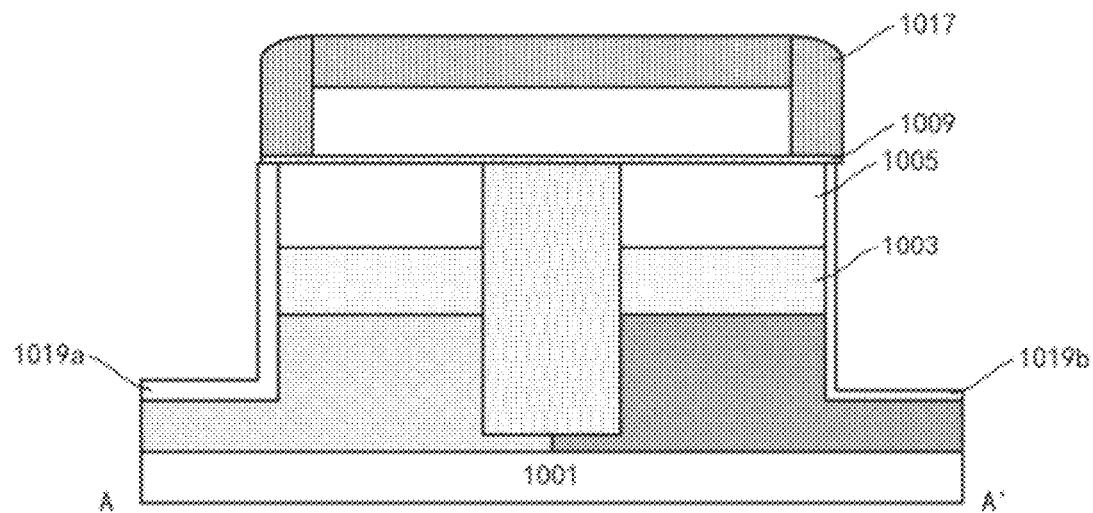

In FIG. 7(*a*), the sidewall of the portion of the first active layer 1019 on the vertical sidewall of the ridge structure is shown to be substantially flush with the sidewall of the spacer 1017. This may be achieved by controlling the amount of etch-back and the thickness of the epitaxial growth to be substantially the same. However, the present disclosure is not limited to this. For example, the sidewall of the portion of the first active layer 1019 on the vertical sidewall of the ridge structure may be recessed with respect to the sidewall of the spacer 1017, or even may protrude.

Due to such epitaxial growth, the material of the first active layer 1019 may be appropriately selected according to performance requirements of the device in the design. For example, the first active layer 1019 may include various semiconductor materials, such as Si, Ge, SiGe, GaAs, InGaAs, etc.

In the embodiment of FIG. 7(*a*), first active layer portions 1019 on the opposite sides of the isolation portion 1007 may have substantially the same characteristics (for example, material, size, etc.). However, the present disclosure is not limited to this. For example, according to performance requirements of the two devices on the opposite sides of the isolation portion 1007 in the design, the first active layer portions 1019 on the opposite sides of the isolation portion 1007 may have a different characteristic, such as different materials and/or sizes. This can be achieved by shielding the other device region when the first active layer is grown in one device region. For example, FIG. 7(*b*) shows that first active layer portions 1019*a* and 1019*b* on the opposite sides of the isolation portion 1007 may have different thicknesses. In addition, for a p-type device, the first active layer 1019*a* may include Si, SiGe, Ge, etc.; and for a n-type device, the first active layer 1019*b* may include Si, InGaAs, InP, or other III-V compound semiconductor.

In order to facilitate subsequent manufacturing of an electrical contact to the lower source/drain portion, a contact region may be formed in the laterally extending portion of the first active layer 1019. For example, ion implantation may be used to inject dopants into the laterally extending portion of the first active layer 1019. The conductivity type of the dopants may be the same as the conductivity type of the contact portion subsequently formed. For example, for a p-type device, p-type dopants such as B, $BF_2$ or In may be injected with a concentration selected from about 1E19-1E21 $cm^{-3}$; and for a n-type device, n-type dopants such as P or As may be injected with a concentration selected from about 1E19-1E21 $cm^{-3}$. The laterally extending portion of the first active layer 1019 containing the dopants (which may be activated by a subsequent annealing process) may form a contact region (see 1019*c* in FIG. 8). Due to the existence of the spacer 1017, ion implantation may not substantially affect the vertical portion (which is subsequently formed to be a channel portion) of the first active layer 1019.

In order to further reduce the contact resistance, silicide may also be formed on the laterally extending portion of the first active layer 1019. For example, a shielding layer (for example, oxynitride in the form of a spacer) may be used to shield the vertically extending portion of the first active layer 1019, then a metal such as NiPt, Co, Ni, Ti, etc. is deposited on the laterally extending portion of the first active layer 1019, and an annealing process is performed to make the metal react with the laterally extending portion of the first active layer 1019, thereby generating silicide. Afterwards, the unreacted metal may be removed, and the shielding layer may be removed.

Figure 8:
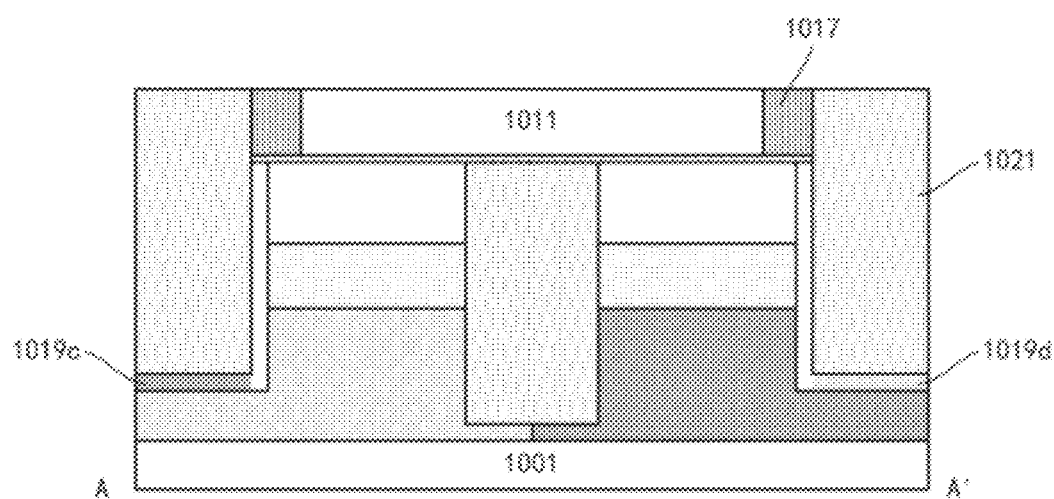

As shown in FIG. 8, an isolation layer 1021 may be formed around the ridge structure on the sidewall of which the first active layer 1019 is formed. For example, an oxide layer that completely covers the ridge structure may be formed by deposition on the substrate 1001, and planarization processing such as chemical mechanical polishing (CMP) (CMP may be stopped at the mandrel pattern 1011) is performed to the deposited oxide layer to form an isolation layer 1021.

Figure 9A:
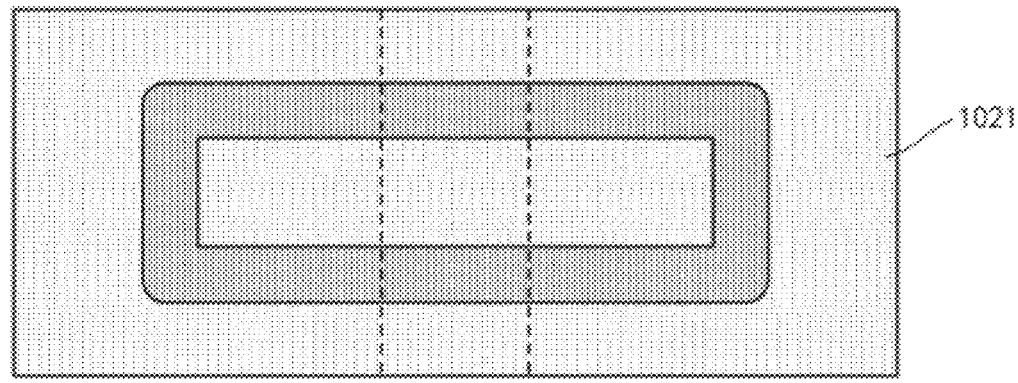
Figure 9B:
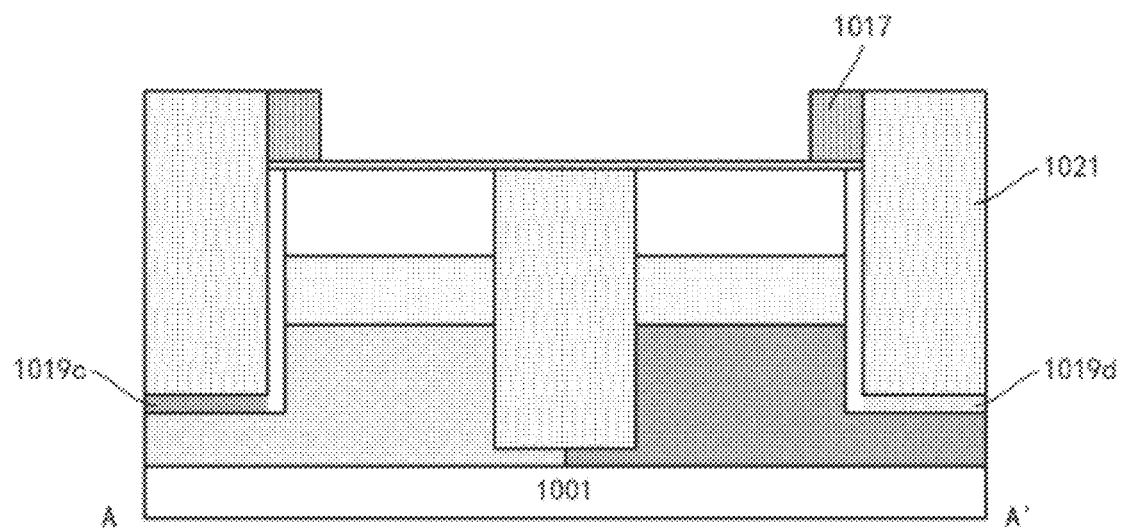

As shown in FIGS. 9(*a*) and 9(*b*), the mandrel pattern 1011 may be removed by selective etching such as wet etching using TMAH solution or dry etching using RIE. In this way, an annular spacer 1017 is remained on the ridge structure. As shown in the top view of FIG. 9(*a*), the spacer 1017 respectively defines two U-shapes opposite to each other on the opposite sides of the isolation portion.

Figure 10:
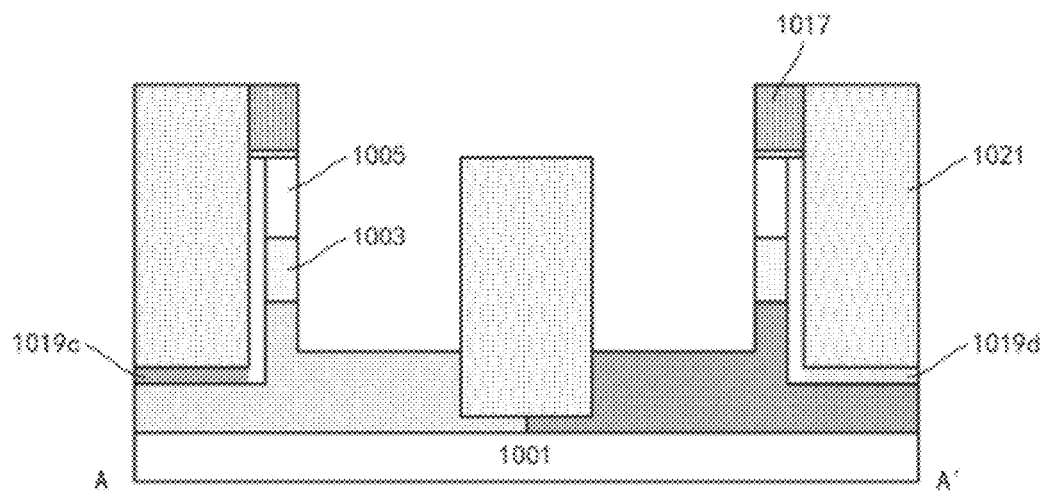

As shown in FIG. 10, the stop layer 1009, the third material layer 1005, the second material layer 1003 and the upper portion of the substrate 1001 may be selectively etched by using the spacer 1017 as an etching mask using, for example RIE. The etching may be performed into the well region of the substrate 1001. In this way, on the opposite sides of the isolation portion, the third material layer 1005, the second material layer 1003, and the upper portion of the substrate 1001 respectively form U shapes corresponding to the spacer 1017.

Of course, the formation of a U-shaped pattern is not limited to the spacer pattern transfer technology, and may also be performed by photolithography using photoresist or the like.

Here, for the purpose of epitaxial growth, the second material layer 1003 for defining the position of the gate stack includes a semiconductor material, which is inconvenient in the following processing to the source/drain portion. For this reason, the second material layer 1003 may be replaced with a dielectric material to form a dummy gate to facilitate subsequent processing to the source/drain portions.

Figure 11A:
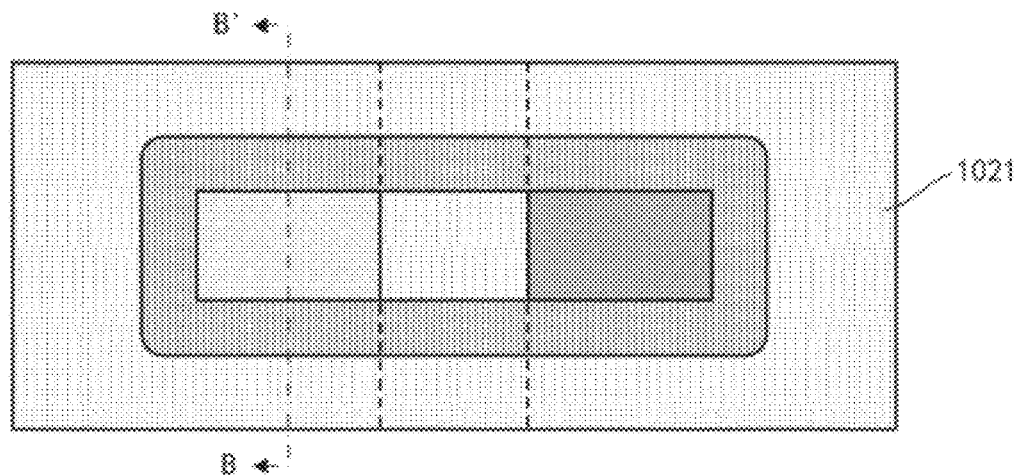
Figure 11B:
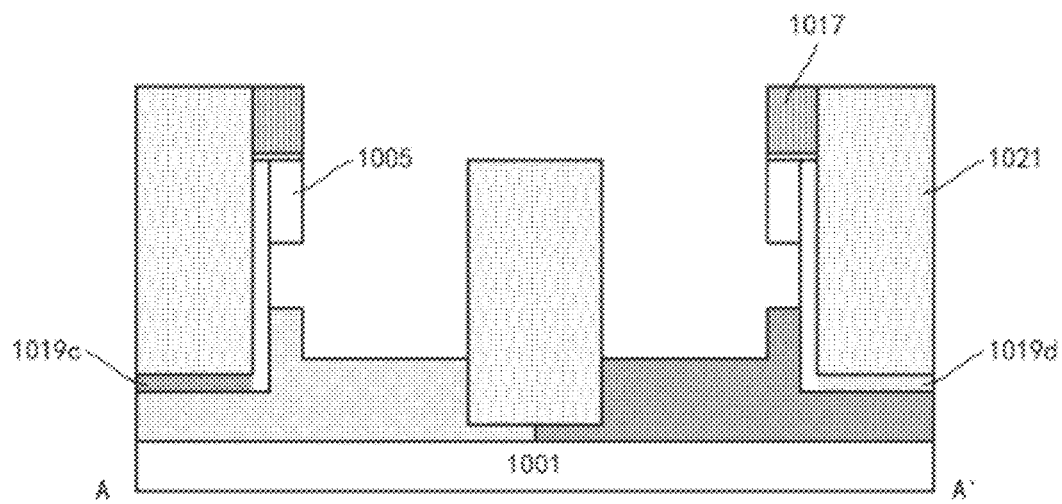
Figure 11C:
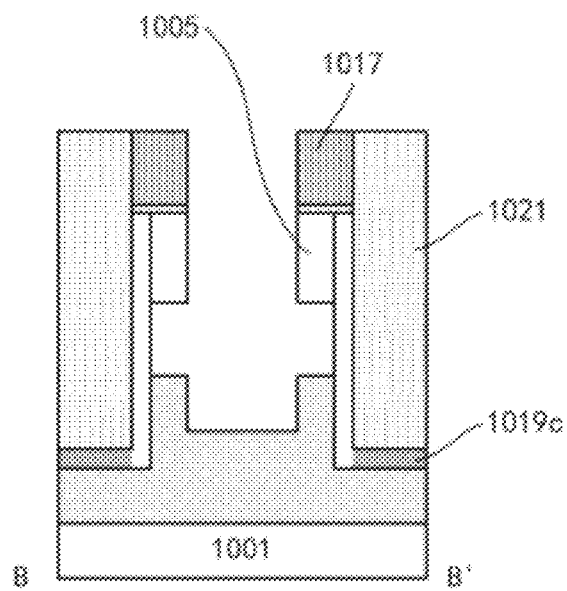
Figure 12A:
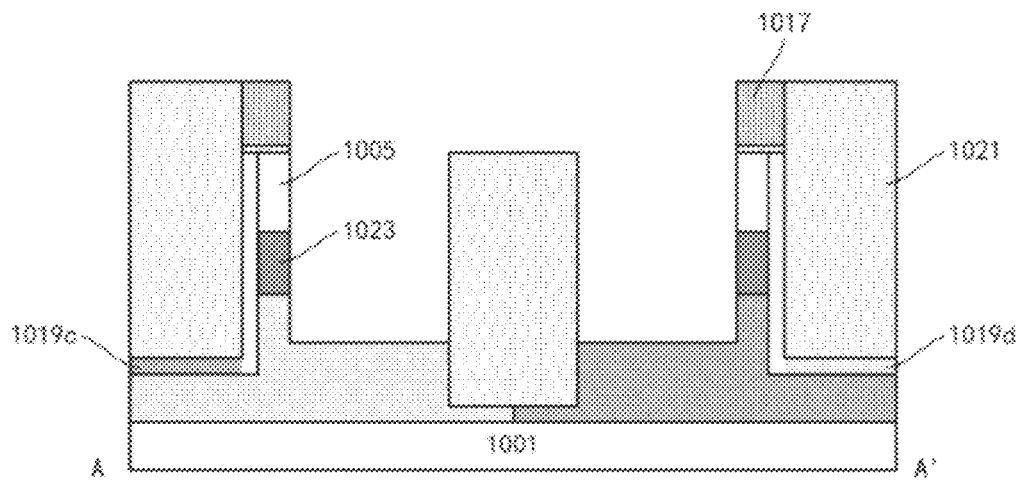
Figure 12B:
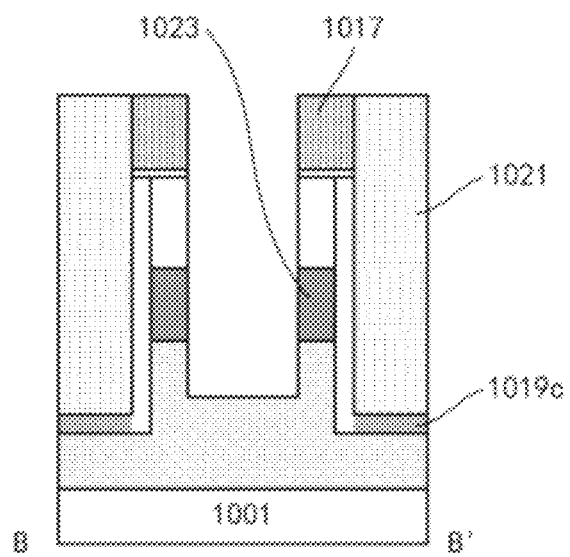

For example, as shown in FIGS. 11(*a*) to 11(*c*), the second material layer 1003 (SiGe in this example) may be removed by selective etching with respect to the first active layer 1019, the substrate 1001 and the third material layer 1005 (they are all Si in this example). Then, as shown in FIGS. 12(*a*) and 12(*b*), a dummy gate 1023 may be formed in the remaining space due to the removal of the second material layer 1003 below the spacer 1017. The dummy gate 1023 may be formed by deposition and then etched-back. For example, the dummy gate 1023 may include a material, such as SiC, having etching selectivity with respect to the first material layer, the third material layer and the first active layer.

Figure 13:
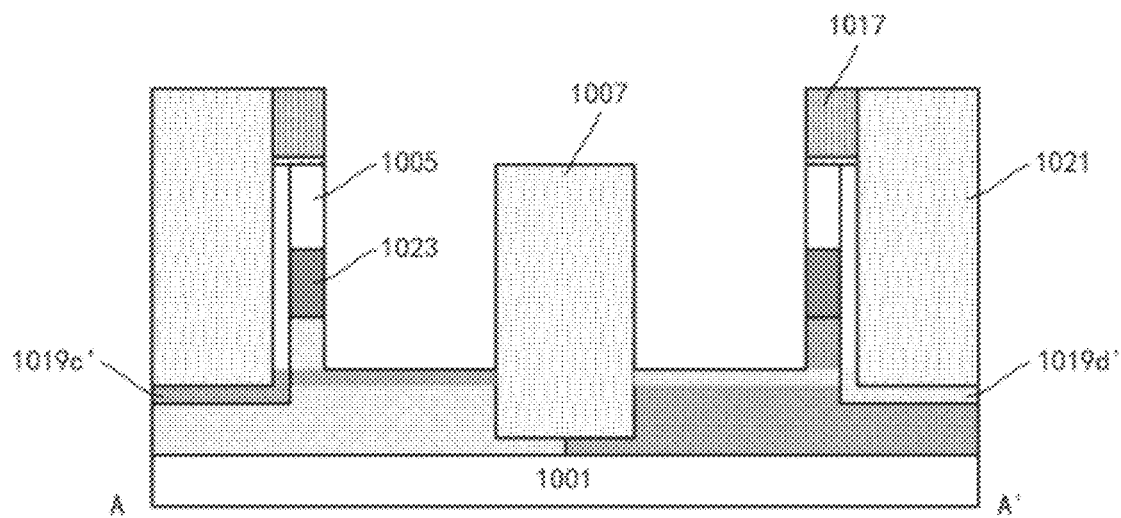

According to an embodiment, the contact region 1019*c* may be thickened to reduce contact resistance from the subsequently formed contact portion to the lower source/drain portion. As shown in FIG. 13, a dopant may be injected into the substrate 1001 on the inner side of the spacer 1017 by ion implantation. The conductivity type of the dopant may be the same as the conductivity type of the lower end contact portion formed subsequently. For example, for a p-type device, p-type dopant such as B, $BF_2$ or In may be injected with a concentration selected from about 1E19-1E21 $cm^{-3}$; and for a n-type device, n-type dopant such as P or As may be injected with a concentration selected from about 1E19-1E21 $cm^{-3}$. Here, the p-type device and the n-type devices may be injected separately. When processing is performed to the devices of one type, a shielding layer may be used to shield the region where the devices of another type are located. In the substrate 1001 on the inner and outer sides of the spacer 1017, the dopants injected twice in succession may be connected to each other by annealing, and they are shown together as 1019c' and 1019d' in the figure.

Afterwards, the source/drain portion may be formed.

In the following embodiment, the first material layer and the third material layer are doped by a solid phase dopant source layer to form the source/drain portion. In order to facilitate the formation of a solid phase dopant source layer on the inner side of the spacer 1017, the isolation portion 1007 (see FIG. 13) that currently occupies a considerable space on the inner side of the spacer 1017 may be recessed to a certain extent to release a certain space and facilitate film filling.

Figure 14A:
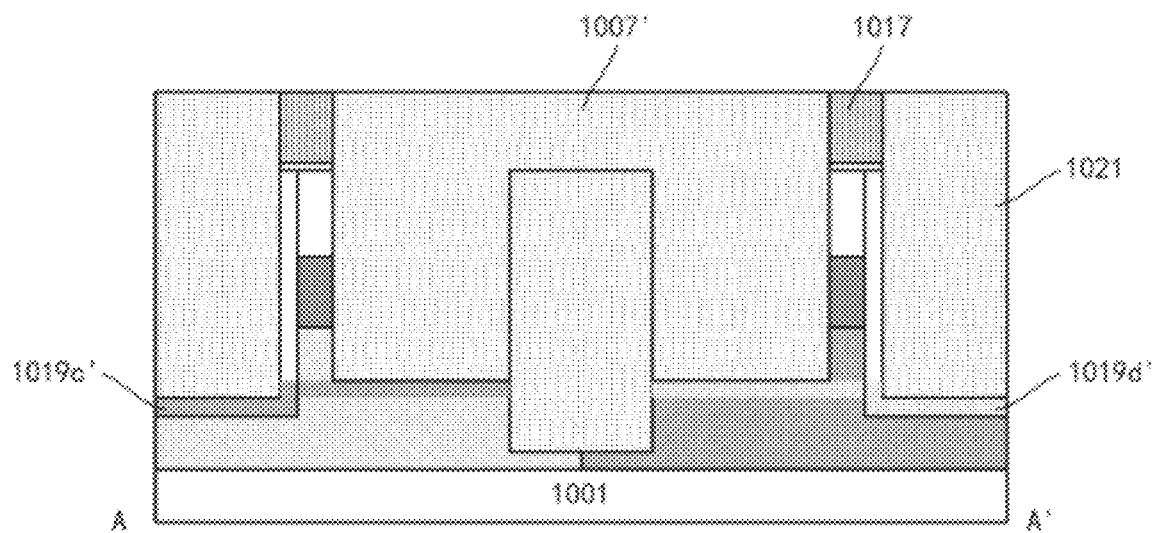
Figure 14B:
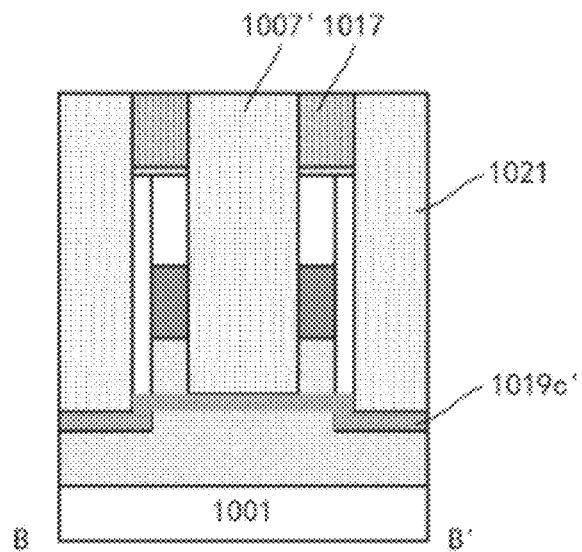

In order to avoid too much influence on the exposed surface of the substrate 1001 when the isolation portion 1007 is recessed, as shown in FIGS. 14(a) and 14(b), a dielectric material 1007' (here, oxide) which is the same as the isolation portion 1007 may be filled by, for example, deposition and then planarization (which is stopped at the spacer 1017) on the inner side of the spacer 1017.

According to an embodiment, before the dielectric material 1007' is filled, a silicide may be formed on the exposed surface of the substrate. For example, a shielding layer (for example, oxynitride in the form of a spacer) may be used to shield the sidewalls of the first material layer, the dummy gate and the third material layer, then a metal such as NiPt, Co, Ni, Ti, etc. is deposited on the exposed surface of the substrate 1001, and annealing processing is performed to make the metal react with the exposed surface of the substrate 1001, thereby generating silicide. Afterwards, the unreacted metal may be removed. The shielding layer may be removed in the subsequent etching process to the dielectric material 1007'.

Figure 15A:
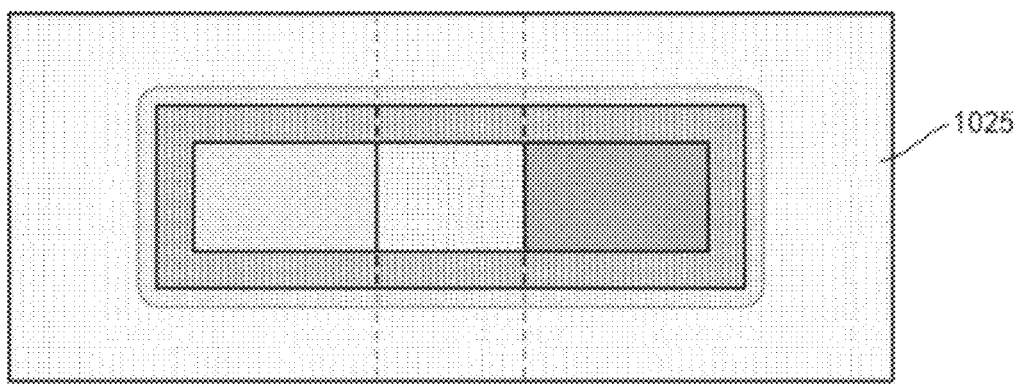
Figure 15B:
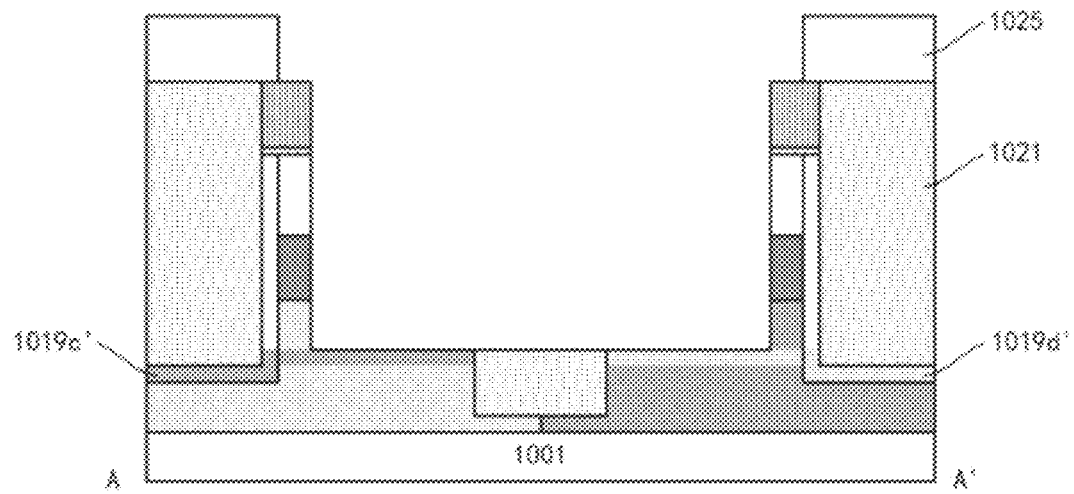
Figure 15C:
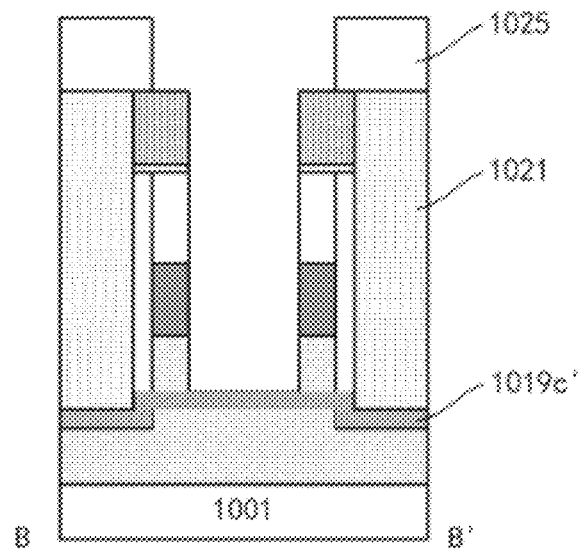

Then, as shown in FIGS. 15(a) to 15(c), the isolation layer 1021 on the outer side of the spacer 1017 may be shielded by a shielding layer such as a photoresist 1025 to expose the dielectric material 1007' on the inner side of the spacer 1017. The exposed dielectric material 1007' and the isolation portion 1007 that may be subsequently exposed, are selectively etched by, e.g., RIE. In the condition that the isolation layer 1021 on the outer side of the spacer 1017 has an etching selectivity with respect to the dielectric material 1007' on the inner side of the spacer 1017 and the isolation portion 1007, the photoresist 1025 may not be required. Here, on the inner side of the spacer 1017, the dielectric material 1007' may be substantially completely removed to expose the surface of the substrate 1001, but a portion of the isolation portion 1007 remains. The remaining isolation portion 1007 may prevent an undesired short circuit when the source/drain portion is formed subsequently, and may prevent a np junction below the isolation portion 1007 from being damaged. Afterwards, the photoresist 1025 may be removed.

FIG. 15(b) shows that the top surface of the remaining isolation portion 1007 is approximately flush with the surface of the substrate 1001. However, the present disclosure is not limited to this. For example, the top surface of the remained isolation portion 1007 may be (slightly) higher or lower than the surface of the substrate 1001.

Figure 16A:
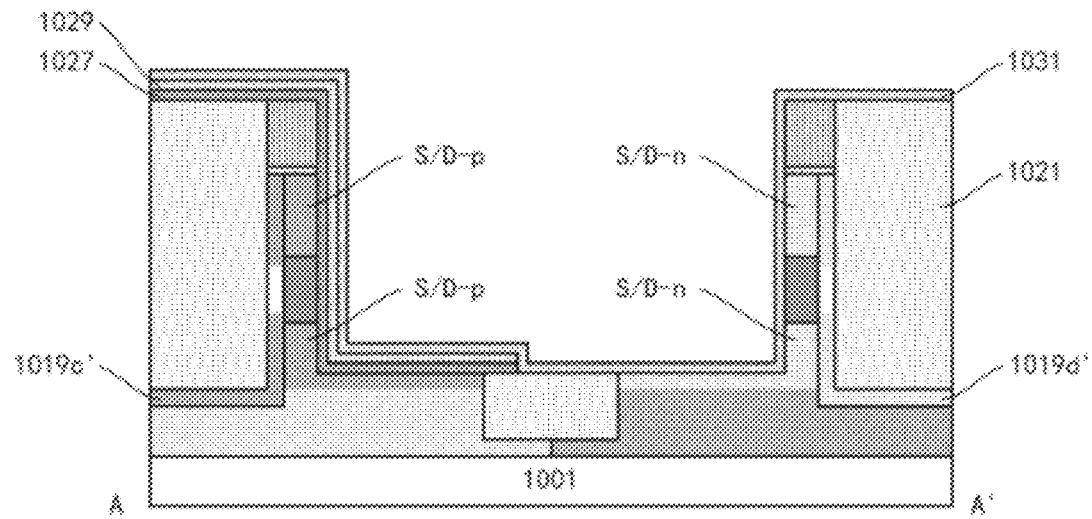
Figure 16B:
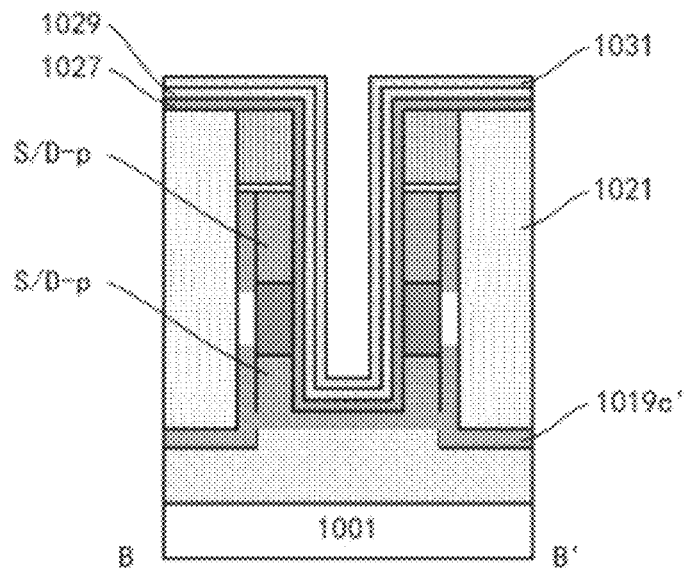

As shown in FIGS. 16(a) and 16(b), a solid phase dopant source layer may be formed on the structure (with the photoresist being removed) shown in FIGS. 15(a) to 15(c) by, for example, deposition. Here, solid-phase dopant source layer portions may be respectively formed for a p-type device and a n-type device. For example, a shielding layer (for example, oxynitride having a thickness selected from about 2 nm-10 nm, not shown) may be used to shield the n-type device region (the region above the p-type well region). Then, a solid phase dopant source layer 1027 for the p-type device may be formed. The solid phase dopant source layer 1027 may extend on the shielding layer. A diffusion barrier layer 1029 (for example, oxynitride having a thickness selected from about 2 nm-5 nm) may be formed on the solid phase dopant source layer 1027. The shielding layer on the n-type device region as well as the solid phase dopant source layer 1027 and the diffusion barrier layer 1029 thereon may be removed, such that the solid phase dopant source layer 1027 remains on the p-type device region (the region above the n-type well region), the diffusion barrier layer 1029 remains on the solid phase dopant source layer 1027, and the n-type device region is exposed. Afterwards, a solid phase dopant source layer 1031 for the n-type device may be formed.

For example, solid phase dopant source layers 1027, 1031 may be oxides containing dopants. The dopants contained in the solid phase dopant source layers 1027, 1031 may be used to dope the source/drain portion and the exposed surface of the substrate 1001, and thus they may have the same conductivity type as the source/drain portion to be formed. For example, for a p-type device, the solid phase dopant source layer 1027 may contain p-type dopant such as B or In; and for a n-type device, the solid phase dopant source layer 1031 may contain n-type dopant such as P or As. The concentration of the dopants of the solid phase dopant source layers 1027, 1031 may be selected from about 0.01%-5%. The dopants in the solid phase dopant source layers 1027 and 1031 may be driven into the first material layer and the third material layer by annealing treatment to form a source/drain portion S/D-p for the p-type device and a source/drain portion S/D-n for the n-type device. In the source/drain portions S/D-p and S/D-n, the concentration of the dopants may be selected from about 1E19-1E21 $cm^{-3}$. Afterwards, the solid phase dopant source layers 1027, 1031 and the diffusion barrier layer 1029 may be removed.

According to an embodiment, the dopants may also be driven into the first active layer 1019, and desirably into an end of the portion of the first active layer 1019 covered by the dummy gate 1023 (defining the channel portion), such that the doping profile of the source/drain portion may have some overlap with the dummy gate 1023 (and the gate stack formed subsequently), which helps to reduce external resistance.

In this example, the dopants may be driven into the first active layer 1019 from the upper and lower sides of the dummy gate via the first material layer and the third material layer, respectively. Therefore, the extent to which the dopants are driven into the first active layer (more specifically, the portion of the first active layer covered by the dummy gate) may be substantially the same at the upper and lower surfaces of the dummy gate. More specifically, the distance between the doped interface between the upper source/drain portion and the channel portion and the upper surface of the dummy gate may be substantially equal to the distance between the doped interface between the lower source/drain portion and the channel portion and the lower surface of the dummy gate. The distance may be selected from about 2 nm-10 nm, for example. In addition, the distance may remain substantially unchanged along the longitudinal extension direction of the dummy gate. In addition, the distance may be substantially the same on both sides of the isolation portion 1007. Therefore, the interface between the source/drain portion S/D-p and the channel portion in the p-type device region and the interface between the source/drain portion S/D-n and the channel portion in the n-type device region may be substantially coplanar.

In this example, the first material layer is provided by the upper portion of the substrate 1001. However, the present disclosure is not limited to this. For example, the first material layer may also be an epitaxial layer on the substrate 1001. In this case, the first material layer and the third material layer may be doped in situ during epitaxy, instead of being doped using a solid phase dopant source layer.

In addition, in this example, the source/drain portion S/D is formed directly based on the first material layer and the third material layer. However, the present disclosure is not limited to this.

Figure 17A:
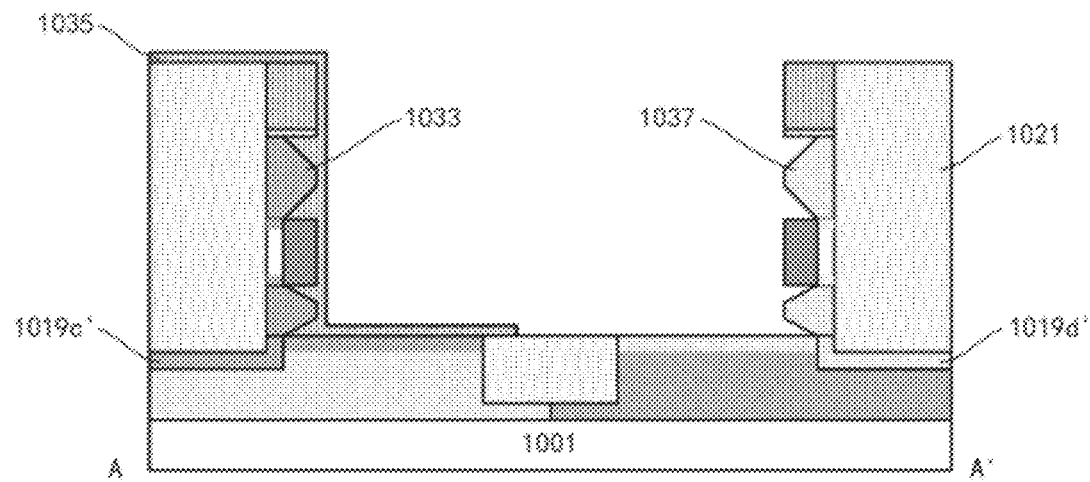
Figure 17B:
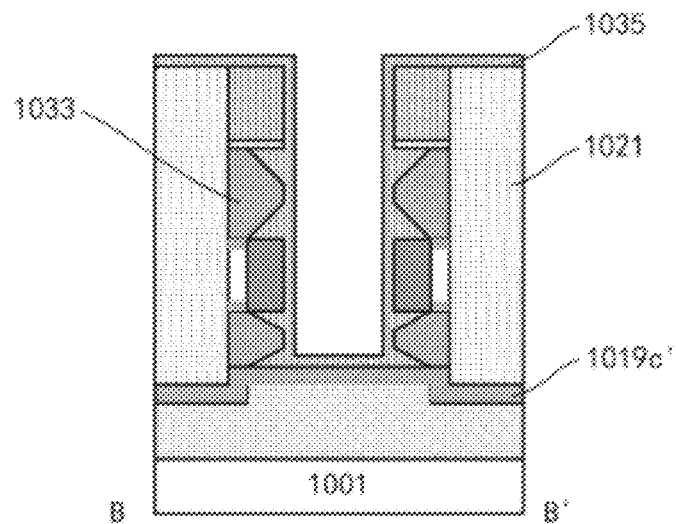

For example, as shown in FIGS. 17(*a*) and 17(*b*), the first material layer and the third material layer may be at least partially etched back by selective etching. Etching back may be performed into the first active layer, but it is desirable to remain a certain thickness of semiconductor layer (the first material layer, the third material layer, or the first active layer) on the upper and lower sides of the dummy gate to serve as a seed layer for subsequent epitaxial growth. Afterwards, second active layers 1033 and 1037 may be formed on the upper and lower sides of the dummy gate by selective epitaxial growth. The second active layers 1033, 1037 may be doped in-situ during growth. In addition, an annealing treatment may be performed to activate the dopants, and the dopants may be driven into the first active layer, such that the doping profile of the source/drain portion as described above may have some overlap with the dummy gate 1023 (and the gate stack formed subsequently).

For a p-type device and a n-type device, the materials of the second active layers 1033 and 1037 may be different. At this time, the second active layers may be grown separately for the p-type device and the n-type device. For example, a shielding layer (for example, oxynitride having a thickness selected from about 2 nm-10 nm, not shown) may be used to shield the n-type device region, then the first material layer and the third material layer of the p-type device region may be etched back, and a second active layer 1033 for the p-type device is grown. Then, a shielding layer 1035 (for example, oxynitride) is used to shield the p-type device region where the second active layer 1033 has been grown, the shielding layer on the n-type device region is removed to expose the first material layer and the third material layer in the n-type device region, and they are also etched back and grown to form a second active layer 1037 for the n-type device. Afterwards, the shielding layer 1035 may be removed.

Here, the material of the second active layers 1033, 1037 may be selected to be, for example, a semiconductor material having a different lattice constant from the first active layer (Si in this example), such that a stress may be applied to the channel region subsequently formed in the first active layer to enhance device performance. For example, for a p-type device, the second active layer 1033 may include SiGe (the atomic percentage of Ge selected from, for example, about 0-75%) such that a compressive stress is applied; and for a n-type device, the second active layer 1037 may include Si:C (the atomic percentage of C selected from, for example, about 0-3%) such that a tensile stress is applied.

In addition, the grown second active layer 1033 may appear as a shape that tapers toward an inner side in a sectional view, for example, a substantially trapezoidal shape. This helps reduce the capacitance between the source/drain portion and the gate stack.

Next, a replacement gate process may be performed to replace the dummy gate with a gate stack.

Figure 18A:
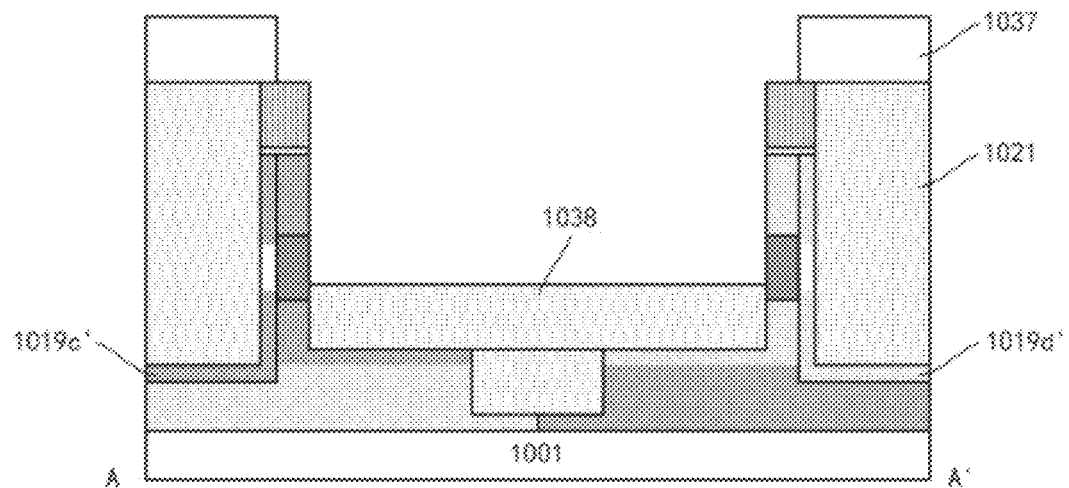
Figure 18B:
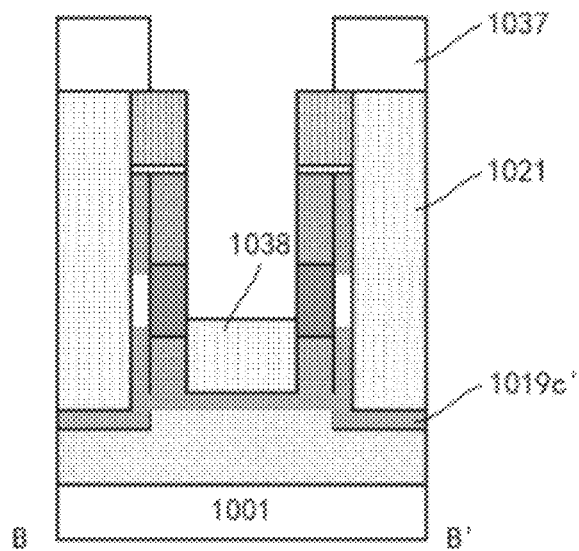

As shown in FIGS. 18(*a*) and 18(*b*), an isolation layer 1038 may be formed on the inner side of the spacer 1017. For example, a dielectric material such as an oxide may be deposited to completely fill the space on the inner side of the spacer 1017. Then, a planarization processing, such as CMP, may be performed to the deposited dielectric material, and the CMP may be stopped at the spacer 1017. Where the deposited dielectric material and the isolation layer 1021 contain the same material such as oxide, a shielding layer such as photoresist 1037 may be formed to shield the isolation layer 1021 on the outer side of the spacer 1017. Afterwards, the deposited dielectric material may be etched back. Dielectric material having a certain thickness remains on the bottom of the space on the inner side of the spacer 1017 to form an isolation layer 1038. The isolation layer 1038 may shield the lower source/drain portion. For example, the top surface thereof is (slightly) higher than the bottom surface of the dummy gate, but the sidewall of the dummy gate is fully exposed for subsequent removal of the dummy gate and filling the gate stack. Afterwards, the photoresist 1037 may be removed.

Figure 19A:
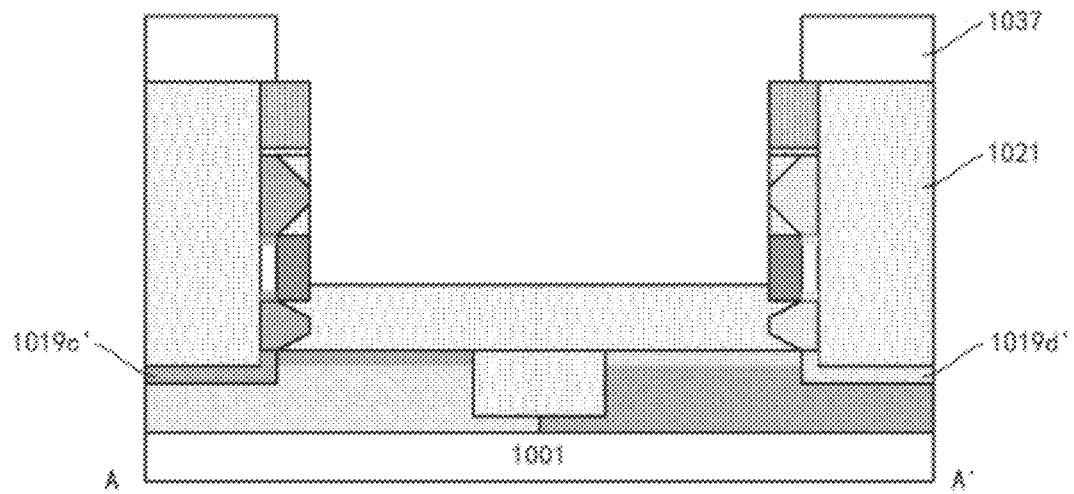
Figure 19B:
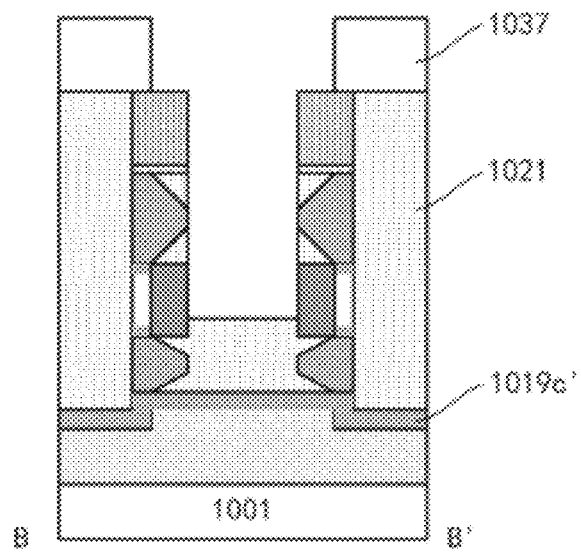

FIGS. 19(*a*) and 19(*b*) show an embodiment of forming the isolation layer 1038 where the second active layers 1033, 1037 are additionally formed as shown in FIGS. 17(*a*) and 17(*b*).

Figure 20A:
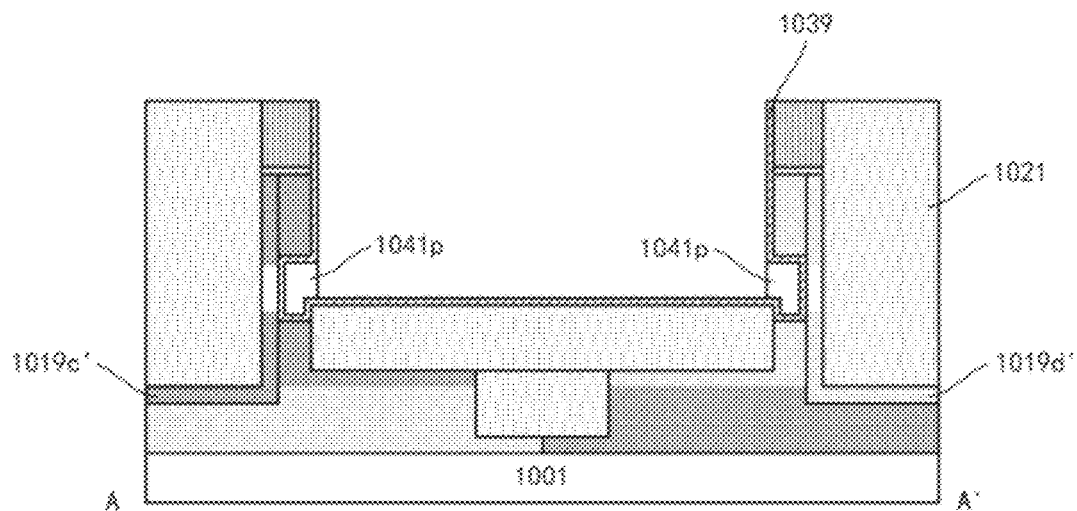
Figure 20B:
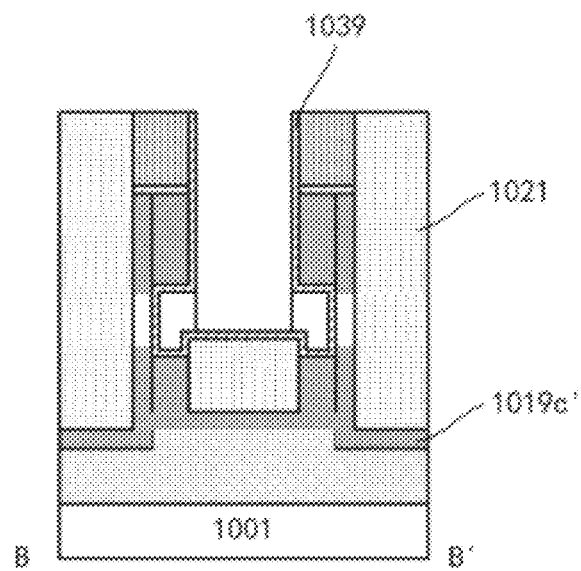

Then, as shown in FIGS. 20(*a*) and 20(*b*), the dummy gate may be removed by selective etching, and a gate stack may be formed on the inner side of the spacer 1017. For example, a gate dielectric layer 1039 may be formed in a substantially conformal manner by deposition, and the remaining space may be filled with a gate conductor layer 1041*p* used for the p-type device. A planarization processing, such as CMP, may be performed to the filled gate conductor layer 1041*p*, and the CMP may be stopped on the spacer 1017. Then, the gate conductor layer 1041*p* may be etched back, and the etching back may be stopped on the gate dielectric layer 1039. In this way, the gate conductor layer 1041*p* remains in the space below the spacer 1017 remained due to the removal of the dummy gate.

Figure 21A:
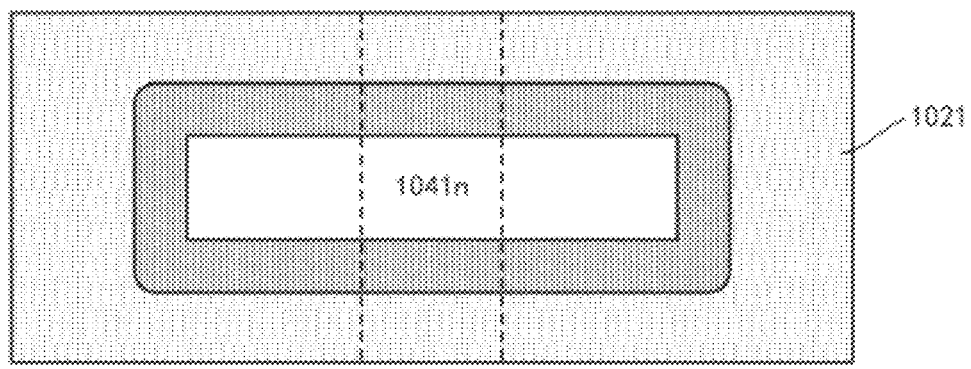
Figure 21B:
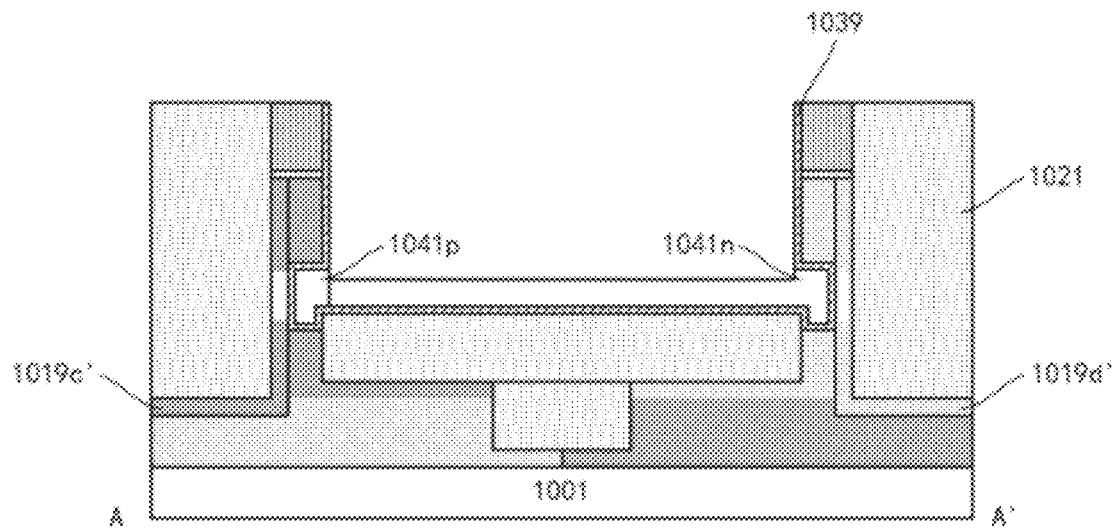

Then, as shown in FIGS. 21(*a*) and 21(*b*), a shielding layer (not shown) may be used to shield the p-type device region, and to expose the n-type device region, and the gate conductor layer 1041*p* on the n-type device region is removed by selective etching. Afterwards, a gate conductor layer 1041*n* used for the n-type device may be filled into the space on the inner side of the spacer 1017. The planarization processing, such as CMP, may be performed to the filled gate conductor layer 1041*n*, and the CMP may be stopped on the spacer 1017. Then, the gate conductor layer 1041*n* may be etched back such that its top surface is lower than the top surface of the original dummy gate to reduce the capacitance between the source/drain portion and the gate stack.

For example, the gate dielectric layer 1039 may include a high-k gate dielectric such as HfO$_2$, having a thickness selected from, for example, about 1 nm-5 nm. Before the high-k gate dielectric is formed, an interface layer may also be formed, for example, an oxide formed by an oxidation process or deposition such as atomic layer deposition (ALD), having a thickness selected from about 0.3 nm-1.5 nm. The gate conductor layer 1041*p* is used for a p-type device, and may include a work function adjusting metal such as TiN, TaN, etc., and a gate conductive metal such as W. Similarly, the gate conductor layer 1041*n* may include a work function adjusting metal such as TiN, TaN, TiAlC, etc., and a gate conductive metal such as W.

In this example, the p-type device and the n-type device have the same gate dielectric layer 1039. However, the present disclosure is not limited to this. For example, the p-type device and the n-type device may have different gate dielectric layers. When different materials are used for devices of different types, they may be processed separately. As described above, when processing is performed to devices of one type, a shielding layer may be used to shield the region where devices of another type are located. Their processing orders may be exchanged.

In this manner, an end portion of the formed gate stack is embedded in the space where the previous dummy gate is located, and overlaps with the first active layer, thereby defining a channel portion in the first active layer. In addition, in the plan view, the gate stack may cover almost the entire space on the inner side of the spacer 1017 on the isolation layer 1038.

Figure 22A:
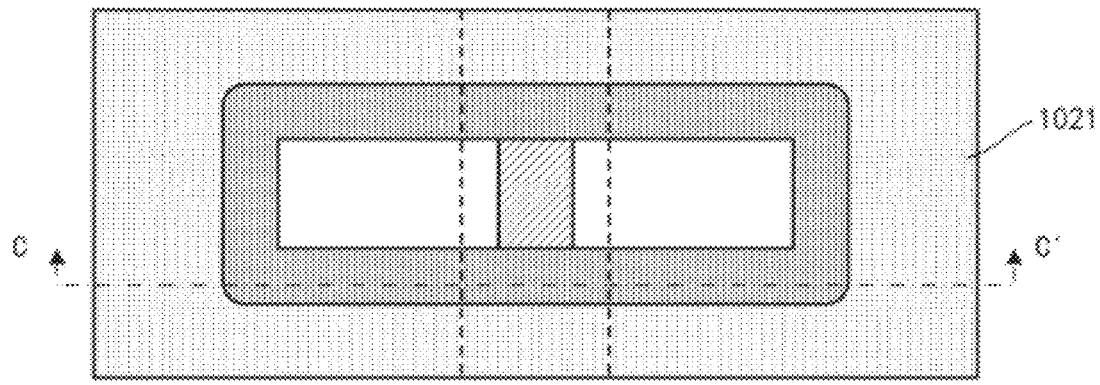
Figure 22B:
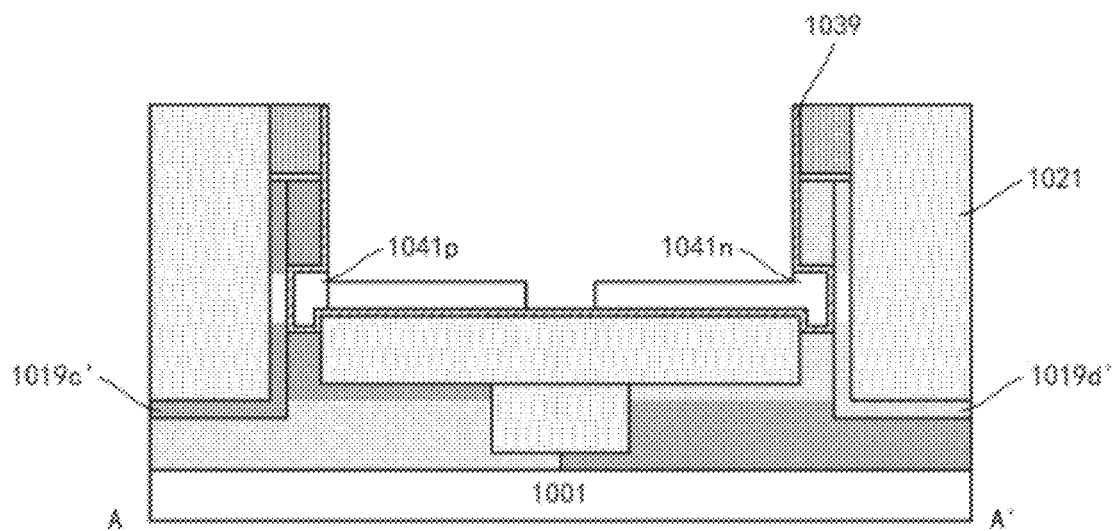

According to the device design, as shown in FIGS. 22(*a*) and 22(*b*), the gate conductor layer 1041*n* may be disconnected between the two devices by, for example, photolithography.

So far, the fabrication of the basic structure of the device is completed. Subsequently, various contacts, interconnecting structures, etc. may be fabricated.

Figure 23A:
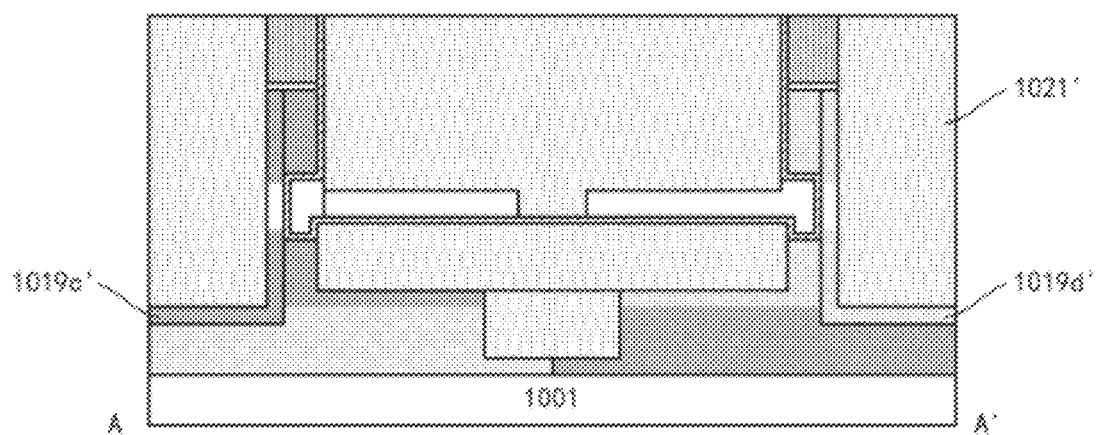
Figure 23B:
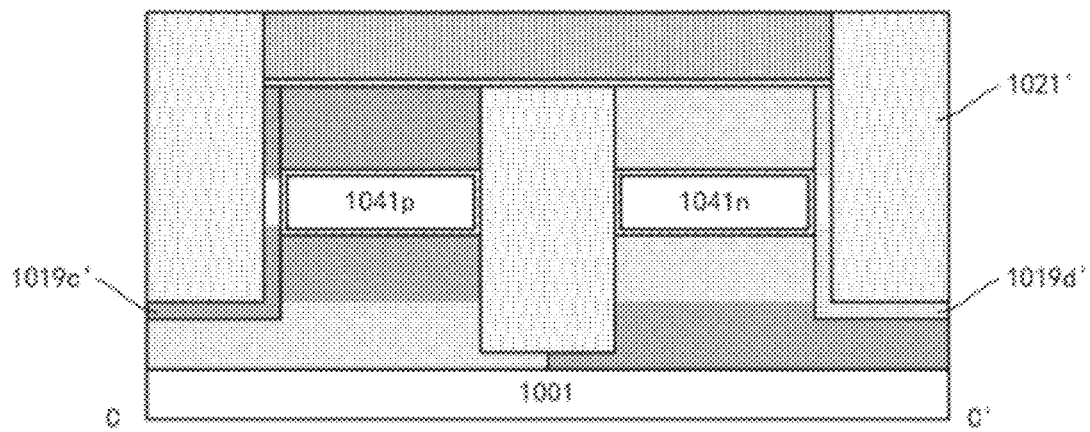
Figure 24:
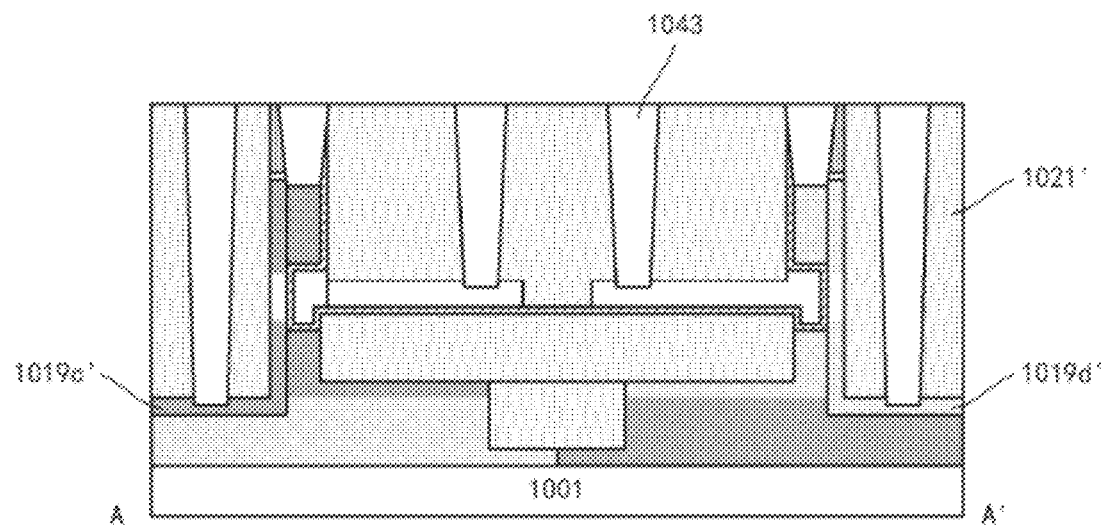

For example, as shown in FIGS. 23(*a*) and 23(*b*), a dielectric material such as oxide (shown together with the previous isolation layer as 1021') may be filled into the space on the inner side of the spacer 1017 by, for example, deposition and then planarization. As shown in FIG. 23(*b*), the previously formed isolation portion 1007 still remains below the spacer 1017. Then, as shown in FIG. 24, a contact hole may be formed in the isolation layer 1021', and a conductive material such as metal may be filled in the contact hole to form a contact portion 1043. The contact portion 1043 may include a contact portion to the source/drain portion of each device and a contact portion to the gate conductor.

Figure 25:
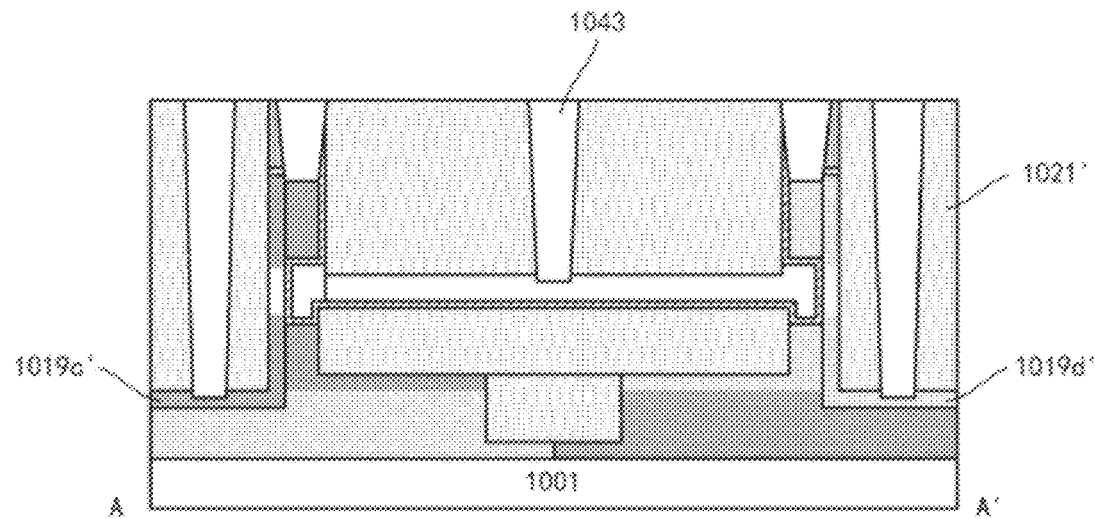

FIG. 25 shows a situation where the gate conductor layer between the p-type device and the n-type device is not disconnected. In this situation, a common contact portion to the gate conductor layers of both the p-type device and the n-type device may be formed.

The semiconductor device according to the embodiments of the present disclosure may be applied to various electronic apparatuses. For example, an integrated circuit (IC) may be formed based on such a semiconductor device, thereby constructing an electronic apparatus. Therefore, the present disclosure also provides an electronic apparatus including the above semiconductor device. The electronic apparatus may further include components such as a display screen matched with an integrated circuit and a wireless transceiver matched with an integrated circuit. Such electronic apparatus include smart phones, computers, tablet computers (PCs), wearable smart devices, mobile power supplies, and so on.

According to an embodiment of the present disclosure, there is provided a method of manufacturing a system on chip (SoC). The method may include the method described above. Specifically, a variety of devices may be integrated on a chip, wherein at least some of the devices are manufactured according to the method of the present disclosure.

In the above description, the technical details such as patterning and etching of each layer are described in detail. However, those skilled in the art should understand that various technical means may be used to form layers, regions, etc. of desired shapes. In addition, in order to form a same structure, those skilled in the art may also design a method that is not completely the same as the method described above. In addition, although the respective embodiments are described above separately, this does not mean that the measures in the respective embodiments may not be advantageously used in combination.

Embodiments are provided according to the following clauses:

1. A semiconductor device comprising a first device and a second device opposite to each other on a substrate, the first device and the second device each comprising:
    a channel portion extending vertically on the substrate and having a U-shape in a plan view;
    source/drain portions respectively located at upper and lower ends of the channel portion and along the U-shaped channel portion; and
    a gate stack overlapping the channel portion on an inner side of the U-shape,
    wherein an opening of the U-shape of the first device and an opening of the U-shape of the second device are opposite to each other, and
    wherein at least a portion of the gate stack of the first device close to the channel portion and at least a portion of the gate stack of the second device close to the channel portion are substantially coplanar.

2. The semiconductor device according to clause 1, wherein at least one of the followings is true:
    an upper source/drain portion of the first device and an upper source/drain portion of the second device are substantially coplanar;
    a lower source/drain portion of the first device and a lower source/drain portion of the second device are substantially coplanar.

3. The semiconductor device according to clause 1, wherein,
    the U-shape of the first device comprises a first arm and a second arm opposite to each other, and
    the U-shape of the second device comprises a third arm and a fourth arm opposite to each other,
    wherein the first arm and the third arm extend oppositely in a substantially same direction, and the second arm and the fourth arm extend oppositely in a substantially same direction.

4. The semiconductor device according to clause 3, wherein the first arm and the third arm extend along a substantially same straight line, and the second arm and the fourth arm extend along a substantially same straight line.

5. The semiconductor device according to clause 1, wherein at least one of the following is true:
    an interface between the upper source/drain portion and the channel portion of the first device and an interface between the upper source/drain portion and the channel portion of the second device are substantially coplanar; and an interface between the lower source/drain portion and the channel portion of the first device and an interface between the lower source/drain portion and the channel portion of the second device are substantially coplanar.

6. The semiconductor device according to clause 1, wherein at least one of the followings is true:
an inner sidewall of the channel portion of the first device and an inner sidewall of the channel portion of the second device are substantially coplanar; and
an outer sidewall of the channel portion of the first device and an outer sidewall of the channel portion of the second device are substantially coplanar.

7. The semiconductor device according to clause 1, wherein at least one of the followings is true:
an inner sidewall of the upper source/drain portion of the first device and an inner sidewall of the upper source/drain portion of the second device are substantially coplanar; and
an outer sidewall of the upper source/drain portion of the first device and an outer sidewall of the upper source/drain portion of the second device are substantially coplanar.

8. The semiconductor device according to clause 1, wherein at least one of the followings is true:
an inner sidewall of at least an upper portion of the lower source/drain portion of the first device and at least the inner sidewall of the lower source/drain portion of the second device are substantially coplanar; and
an outer sidewall of at least the upper portion of the lower source/drain portion of the first device and at least the outer sidewall of the lower source/drain portion of the second device are substantially coplanar.

9. The semiconductor device according to clause 1, the first device and the second device each further comprising:
a hard mask layer on an upper source/drain portion, wherein the hard mask layers of the first device and the second device form a closed loop.

10. The semiconductor device according to clause 1, wherein the respective channel portions of the first device and the second device have a substantially same thickness along the U-shape.

11. The semiconductor device according to clause 10, wherein a thickness of the channel portion of the first device is different from that of the channel portion of the second device.

12. The semiconductor device according to clause 1, wherein the source/drain portions of each of the first device and the second device protrudes toward an inner side of the U-shape with respect to the channel portion, such that the source/drain portions and the channel portion are of C-shape in a sectional view.

13. The semiconductor device according to clause 12, wherein a protruding extent of the source/drain portion of the first device with respect to the channel portion is substantially the same as a protruding extent of the source/drain portion of the second device with respect to the channel portion.

14. The semiconductor device according to clause 12, wherein an end portion of the gate stack close to the channel portion is embedded in the C-shape.

15. The semiconductor device according to clause 12, wherein the source/drain portion has a shape that tapers toward an inner side of the U-shape in a sectional view.

16. The semiconductor device according to clause 1, wherein the U-shape has rounded corners.

17. The semiconductor device according to clause 1, wherein for each of the first device and the second device, a distance between an doped interface between the upper source/drain portion and the channel portion and an upper surface of an end portion of the gate stack close to the channel portion is substantially the same as a distance between an doped interface between the lower source/drain portion and the channel portion and a lower surface of the end portion of the gate stack close to the channel portion.

18. The semiconductor device according to clause 17, wherein the distance is 2 nm-10 nm.

19. The semiconductor device according to clause 17, wherein the distance of the first device is substantially the same as the distance of the second device.

20. The semiconductor device of clause 1, wherein a doping profile of the source/drain portion has an end portion overlapping the gate stack.

21. The semiconductor device according to clause 1, wherein the channel portion of each of the first device and the second device is formed in a first semiconductor layer, the first semiconductor layer vertically extends to the source/drain portion such that each of end portions located at the upper and lower end constitutes a portion of a corresponding source/drain portion, and the source/drain portion further comprises a second semiconductor layer and a third semiconductor layer on the end portions of the upper and lower end of the first semiconductor layer.

22. The semiconductor device according to clause 21, wherein the second semiconductor layer and the third semiconductor layer of each of the first device and the second device comprise a material different from the first semiconductor layer.

23. The semiconductor device according to clause 21, wherein a first semiconductor layer of the first device and a first semiconductor layer of the second device have different materials and/or thicknesses.

24. The semiconductor device according to clause 21, wherein the second semiconductor layer and the third semiconductor layer of the first device comprise a material different from the second semiconductor layer and the third semiconductor layer of the second device.

25. The semiconductor device of clause 21, wherein the third semiconductor layer is a portion of the substrate.

26. The semiconductor device according to clause 21, wherein the first semiconductor layer further comprises a portion extending laterally toward an outer side of the U-shape on the substrate.

27. The semiconductor device according to clause 1, wherein the outer sidewalls of at least an upper portion of the lower source/drain portion, the upper source/drain portion, and the channel portion of each of the first device and the second device are substantially coplanar.

28. The semiconductor device according to clause 1, wherein the channel portion and the source/drain portion comprise a single crystal semiconductor material.

29. The semiconductor device according to clause 1, wherein, in a plan view, the gate stack is inside the U-shape.

30. The semiconductor device according to clause 29, wherein, in a plan view, the gate stack is throughout the inside of the U-shape.
31. The semiconductor device according to clause 1, wherein the first device and the second device have different conductivity types.
32. The semiconductor device according to clause 31, wherein the first device and the second device constitute a complementary metal oxide semiconductor CMOS configuration.
33. The semiconductor device according to clause 31, wherein gate conductors in the gate stacks of the first device and the second device are in contact with each other and electrically connected.
34. The semiconductor device according to clause 33, wherein a connection surface between the gate conductors of the first device and the second device is biased toward the first device.
35. The semiconductor device according to clause 31, wherein the first device and the second device are respectively formed on well regions of different conductivity types in the substrate.
36. The semiconductor device of clause 31, wherein the first device and the second device comprise gate stacks having different equivalent work functions.
37. The semiconductor device according to clause 31, wherein,
the first device is a p-type device, and the source/drain portion thereof applies a compressive stress to the channel portion, and
the second device is a n-type device, and the source/drain portion thereof applies a tensile stress to the channel portion.
38. An electronic apparatus comprising a semiconductor device according to clause 1.
39. The electronic apparatus according to clause 38, comprising smart phones, computers, tablet computers, wearable smart devices, artificial intelligence devices, and mobile power supplies.

The above embodiments are only exemplary embodiments of the present disclosure, and are not used to limit the present disclosure, and the protection scope of the present disclosure is defined by the claims. Those skilled in the art may make various modifications or equivalent substitutions to the present disclosure within the essence and protection scope of the present disclosure, and such modifications or equivalent substitutions should also be regarded as falling within the protection scope of the present disclosure.

What is claimed is:
1. A semiconductor device comprising a first device and a second device opposite to each other on a substrate, the first device and the second device each comprising:
a channel portion extending vertically on the substrate and having a U-shape in a plan view;
source/drain portions respectively located at upper and lower ends of the channel portion and along the U-shaped channel portion; and
a gate stack overlapping the channel portion on an inner side of the U-shape,
wherein an opening of the U-shape of the first device and an opening of the U-shape of the second device are opposite to each other,
wherein at least a portion of the gate stack of the first device close to the channel portion and at least a portion of the gate stack of the second device close to the channel portion are substantially coplanar, and
wherein the source/drain portions of each of the first device and the second device protrudes toward an inner side of the U-shape with respect to the channel portion, such that the source/drain portions and the channel portion are of C-shape in a sectional view.
2. The semiconductor device according to claim 1, wherein:
an upper source/drain portion of the first device and an upper source/drain portion of the second device are substantially coplanar; and/or
a lower source/drain portion of the first device and a lower source/drain portion of the second device are substantially coplanar.
3. The semiconductor device according to claim 1, wherein,
the U-shape of the first device comprises a first arm and a second arm opposite to each other, and
the U-shape of the second device comprises a third arm and a fourth arm opposite to each other,
wherein the first arm and the third arm extend oppositely in a substantially same direction, and the second arm and the fourth arm extend oppositely in a substantially same direction.
4. The semiconductor device according to claim 3, wherein the first arm and the third arm extend along a substantially same straight line, and the second arm and the fourth arm extend along a substantially same straight line.
5. The semiconductor device according to claim 1, wherein:
an interface between the upper source/drain portion and the channel portion of the first device and an interface between the upper source/drain portion and the channel portion of the second device are substantially coplanar; and/or
an interface between the lower source/drain portion and the channel portion of the first device and an interface between the lower source/drain portion and the channel portion of the second device are substantially coplanar.
6. The semiconductor device according to claim 1, wherein:
an inner sidewall of the channel portion of the first device and an inner sidewall of the channel portion of the second device are substantially coplanar; and/or
an outer sidewall of the channel portion of the first device and an outer sidewall of the channel portion of the second device are substantially coplanar.
7. The semiconductor device according to claim 1, wherein:
an inner sidewall of the upper source/drain portion of the first device and an inner sidewall of the upper source/drain portion of the second device are substantially coplanar; and/or
an outer sidewall of the upper source/drain portion of the first device and an outer sidewall of the upper source/drain portion of the second device are substantially coplanar.
8. The semiconductor device according to claim 1, wherein:
an inner sidewall of at least an upper portion of the lower source/drain portion of the first device and an inner sidewall of the lower source/drain portion of the second device are substantially coplanar; and/or
an outer sidewall of an upper portion of the lower source/drain portion of the first device and an outer sidewall of the lower source/drain portion of the second device are substantially coplanar.

9. A semiconductor device comprising a first device and a second device opposite to each other on a substrate, the first device and the second device each comprising:
- a channel portion extending vertically on the substrate and having a U-shape in a plan view;
- source/drain portions respectively located at upper and lower ends of the channel portion and along the U-shaped channel portion; and
- a gate stack overlapping the channel portion on an inner side of the U-shape,
- wherein an opening of the U-shape of the first device and an opening of the U-shape of the second device are opposite to each other,
- wherein at least a portion of the gate stack of the first device close to the channel portion and at least a portion of the gate stack of the second device close to the channel portion are substantially coplanar, and
- wherein the first device and the second device each further comprise a hard mask layer on an upper source/drain portion, wherein the hard mask layers of the first device and the second device form a closed loop.

10. The semiconductor device according to claim 1, wherein the respective channel portions of the first device and the second device have a substantially same thickness along the U-shape.

11. The semiconductor device according to claim 10, wherein a thickness of the channel portion of the first device is different from that of the channel portion of the second device.

12. The semiconductor device according to claim 1, wherein a protruding extent of the source/drain portions of the first device with respect to the channel portion is substantially the same as a protruding extent of the source/drain portions of the second device with respect to the channel portion.

13. The semiconductor device according to claim 1, wherein an end portion of the gate stack close to the channel portion is embedded in the C-shape.

14. The semiconductor device according to claim 1, wherein the source/drain portions have a shape that tapers toward an inner side of the U-shape in a sectional view.

15. The semiconductor device according to claim 1, wherein the U-shape has rounded corners.

16. A semiconductor device comprising a first device and a second device opposite to each other on a substrate, the first device and the second device each comprising:
- a channel portion extending vertically on the substrate and having a U-shape in a plan view;
- source/drain portions respectively located at upper and lower ends of the channel portion and along the U-shaped channel portion; and
- a gate stack overlapping the channel portion on an inner side of the U-shape,
- wherein an opening of the U-shape of the first device and an opening of the U-shape of the second device are opposite to each other,
- wherein at least a portion of the gate stack of the first device close to the channel portion and at least a portion of the gate stack of the second device close to the channel portion are substantially coplanar, and
- wherein for each of the first device and the second device, a distance between a doped interface between the upper source/drain portion and the channel portion and an upper surface of an end portion of the gate stack close to the channel portion is substantially the same as a distance between a doped interface between the lower source/drain portion and the channel portion and a lower surface of the end portion of the gate stack close to the channel portion.

17. The semiconductor device according to claim 16, wherein the distance is selected from 2 nm-10 nm.

18. The semiconductor device according to claim 16, wherein the distance of the first device is substantially the same as the distance of the second device.

19. The semiconductor device according to claim 1, wherein a doping profile of the source/drain portions has an end portion overlapping the gate stack.

20. The semiconductor device according to claim 1, wherein the channel portion of each of the first device and the second device is formed in a first semiconductor layer, the first semiconductor layer vertically extends to the source/drain portions such that each of end portions located at the upper and lower end constitutes a portion of a corresponding source/drain portion, and the source/drain portions further comprise a second semiconductor layer and a third semiconductor layer on the end portions of the upper and lower end of the first semiconductor layer.

21. The semiconductor device according to claim 20, wherein the second semiconductor layer and the third semiconductor layer of each of the first device and the second device comprise a material different from the first semiconductor layer.

22. The semiconductor device according to claim 20, wherein a first semiconductor layer of the first device and a first semiconductor layer of the second device have different materials and/or thicknesses.

23. The semiconductor device according to claim 20, wherein the second semiconductor layer and the third semiconductor layer of the first device comprise a material different from the second semiconductor layer and the third semiconductor layer of the second device.

24. The semiconductor device according to claim 20, wherein the third semiconductor layer is a portion of the substrate.

25. The semiconductor device according to claim 20, wherein the first semiconductor layer further comprises a portion extending laterally toward an outer side of the U-shape on the substrate.

26. The semiconductor device according to claim 1, wherein outer sidewalls of at least an upper portion of the lower source/drain portion, of the upper source/drain portion, and of the channel portion of each of the first device and the second device are substantially coplanar.

27. The semiconductor device according to claim 1, wherein the channel portion and the source/drain portions comprise a single crystal semiconductor material.

28. The semiconductor device according to claim 1, wherein, in a plan view, the gate stack is inside the U-shape.

29. The semiconductor device according to claim 28, wherein, in a plan view, the gate stack is throughout the inside of the U-shape.

30. The semiconductor device according to claim 1, wherein the first device and the second device have different conductivity types.

31. The semiconductor device according to claim 30, wherein the first device and the second device constitute a complementary metal oxide semiconductor CMOS configuration.

32. The semiconductor device according to claim 30, wherein gate conductors in the gate stacks of the first device and the second device are in contact with each other and electrically connected.

33. The semiconductor device according to claim 32, wherein a connection surface between the gate conductors of the first device and the second device is biased toward the first device.

34. The semiconductor device according to claim 30, wherein the first device and the second device are respectively formed on well regions of different conductivity types in the substrate.

35. The semiconductor device according to claim 30, wherein the first device and the second device comprise gate stacks having different equivalent work functions.

36. The semiconductor device according to claim 30, wherein:
the first device is a p-type device, and the source/drain portions thereof apply a compressive stress to the channel portion, and
the second device is a n-type device, and the source/drain portions thereof apply a tensile stress to the channel portion.

37. An electronic apparatus comprising the semiconductor device according to claim 1.

38. The electronic apparatus according to claim 37, comprising a smart phone, a computer, a tablet computer, a wearable smart device, an artificial intelligence device, or a mobile power supply.

39. The semiconductor device according to claim 1, wherein the first device and the second device each further comprise a hard mask layer on an upper source/drain portion, wherein the hard mask layers of the first device and the second device form a closed loop or wherein for each of the first device and the second device, a distance between a doped interface between the upper source/drain portion and the channel portion and an upper surface of an end portion of the gate stack close to the channel portion is substantially the same as a distance between a doped interface between the lower source/drain portion and the channel portion and a lower surface of the end portion of the gate stack close to the channel portion.

\* \* \* \* \*